(12) United States Patent
Sakai et al.

(10) Patent No.: US 9,238,257 B2
(45) Date of Patent: Jan. 19, 2016

(54) METHOD OF MANUFACTURING SEMICONDUCTOR DEVICE, CLEANING METHOD, AND SUBSTRATE PROCESSING APPARATUS

(75) Inventors: Masanori Sakai, Takaoka (JP); Yukinao Kaga, Toyama (JP); Takashi Yokogawa, Toyama (JP); Tatsuyuki Saito, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/862,180

(22) Filed: Aug. 24, 2010

(65) Prior Publication Data
US 2011/0059600 A1    Mar. 10, 2011

(30) Foreign Application Priority Data

Aug. 27, 2009 (JP) ................. 2009-196950
Jul. 6, 2010 (JP) ................. 2010-154278

(51) Int. Cl.
*H01L 21/00* (2006.01)
*B08B 7/00* (2006.01)
(Continued)

(52) U.S. Cl.
CPC ............... *B08B 7/00* (2013.01); *C23C 16/4404* (2013.01); *C23C 16/4405* (2013.01); *H01L 21/28562* (2013.01); *H01L 21/67028* (2013.01)

(58) Field of Classification Search
CPC .......... H01L 21/67005; H01L 21/67028; H01L 21/28562; B08B 7/00; C23C 16/4404; C23C 16/4405
USPC .......... 134/1.1, 1.2, 1.3, 2; 438/696, 706, 905, 438/584, 689, 694, 755, 759, 778, 795, 800, 438/906, FOR. 100, FOR. 110; 257/E21.214, E21.224, E21.226, 257/E21.227; 216/58, 74, 75, 76, 77, 78, 216/79, 80, 81

See application file for complete search history.

(56) References Cited

U.S. PATENT DOCUMENTS 5,421,957 A * 6/1995 Carlson et al. .................. 216/58
5,679,215 A * 10/1997 Barnes et al. .................. 134/1.1
(Continued)

FOREIGN PATENT DOCUMENTS

JP    2003-027240    1/2003
JP    2004-146787    5/2004
(Continued)

*Primary Examiner* — Victor A Mandala
*Assistant Examiner* — Quovaunda V Jefferson
(74) *Attorney, Agent, or Firm* — Brundidge & Stanger, P.C.

(57) ABSTRACT

It is possible to efficiently remove deposited materials such as a conductive film or insulting film adhered to parts such as the inner wall of a processing chamber and a substrate supporting tool disposed in the processing chamber. There is provided a method of manufacturing a semiconductor device. The method comprises: loading a substrate into a processing chamber; forming a conductive film or an insulating film on the substrate by supplying a plurality of source gases into the processing chamber; unloading the substrate from the processing chamber; and modifying a conductive film or an insulating film adhered to the processing chamber by supplying a modifying gas into the processing chamber. After performing a cycle of the loading, the forming, the unloading, and the modifying processes a plurality of times, the modified conductive film or the modified insulating film adhered to the processing chamber is removed from the processing chamber by supplying a cleaning gas into the processing chamber.

17 Claims, 11 Drawing Sheets

(51) Int. Cl.
*H01L 21/67* (2006.01)
*C23C 16/44* (2006.01)
*H01L 21/285* (2006.01)

(56) References Cited

U.S. PATENT DOCUMENTS

| | | | |
|---|---|---|---|
| 6,203,613 B1* | 3/2001 | Gates et al. | 117/104 |
| 6,284,052 B2* | 9/2001 | Nguyen et al. | 134/1 |
| 6,450,117 B1* | 9/2002 | Murugesh et al. | 118/723 M E |
| 6,589,611 B1* | 7/2003 | Li et al. | 427/579 |
| 6,911,233 B2* | 6/2005 | Lin | 427/237 |
| 2001/0017286 A1* | 8/2001 | Zanotti | 216/13 |
| 2001/0055738 A1* | 12/2001 | Takahashi et al. | 432/2 |
| 2002/0104555 A1* | 8/2002 | Sugano | 134/30 |
| 2003/0034053 A1* | 2/2003 | Nishimura et al. | 134/19 |
| 2003/0082296 A1* | 5/2003 | Elers et al. | 427/96 |
| 2003/0124791 A1* | 7/2003 | Summerfelt et al. | 438/238 |
| 2003/0205237 A1* | 11/2003 | Sakuma | 134/1.1 |
| 2004/0219793 A1* | 11/2004 | Hishiya et al. | 438/706 |
| 2005/0066994 A1* | 3/2005 | Biles et al. | 134/1.1 |
| 2005/0153503 A1* | 7/2005 | Joo | 438/202 |
| 2005/0268851 A1* | 12/2005 | Yamamoto | 118/723 IR |
| 2005/0272271 A1 | 12/2005 | Furuya et al. | |
| 2006/0121194 A1* | 6/2006 | Aiso | 427/248.1 |
| 2009/0117743 A1* | 5/2009 | Nodera et al. | 438/694 |
| 2009/0233453 A1* | 9/2009 | Mani et al. | 438/772 |

FOREIGN PATENT DOCUMENTS

| | | |
|---|---|---|
| JP | 2005-330546 | 12/2005 |
| JP | 2007-227501 * | 9/2007 |
| JP | 2009-124050 | 6/2009 |
| TW | 486760 | 11/2002 |
| WO | 2004070079 A1 | 8/2004 |

* cited by examiner

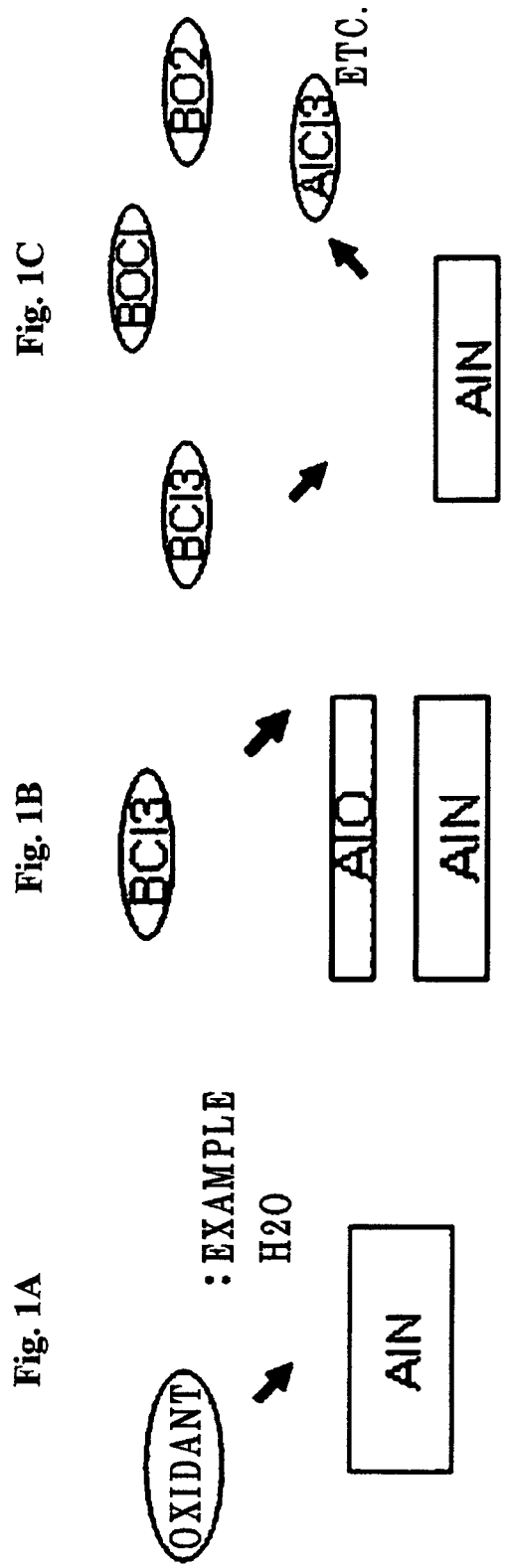

METHOD OF MANUFACTURING SEMICONDUCTOR DEVICE, CLEANING METHOD, AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Applications No. 2009-196950 filed on Aug. 27, 2009, and No. 2010-154278, filed on Jul. 6, 2010, in the Japanese Patent Office, the entire contents of which are hereby incorporated by reference.

BACKGROUND OF THE INVENTION

1. Field of the Invention

The present invention relates to a method of manufacturing a semiconductor device through a substrate processing process, and relates to a cleaning method and a substrate processing apparatus.

2. Description of the Related Art

As a method of forming a predetermined film on a substrate, there is a chemical vapor deposition (CVD) method. In a CVD method, two or more sources are caused to react with each other in a gaseous state or on the surface of a substrate to form a film including elements of source molecules on the substrate. As another method of forming a predetermined film on a substrate, there is an atomic layer deposition (ALD) method. In an ALD method, two or more film-forming sources are alternately supplied to a substrate under predetermined film formation conditions (temperature, time, etc.), and the sources are adsorbed on the substrate on an atomic layer basis to form a film by a surface reaction. As compared with a conventional CVD method, the ALD process can be performed at a lower substrate temperature (process temperature), and the thickness of a film formed on a substrate can be controlled by adjusting the execution number of a film-forming cycle.

An aluminum nitride (AlN) film and a titanium nitride (TiN) film are examples of a conductive film that can be formed on a substrate. In addition, there are examples of other conductive films such as a tantalum (Ta) film, a tungsten (W) film, a manganese (Mn) film, a film made of a nitride thereof, a titanium (Ti) film, and an aluminum (Al) film. In addition, examples of insulating films include a film formed by oxidizing Hf, Zr, or Al, and a film formed by nitriding Hf, Zr, or Al.

Such a conductive film or insulating film may be formed by supplying a process gas into a processing chamber in which a substrate is loaded. However, when such a conductive film or insulating film is formed, deposited materials including such a conductive film or insulating film are adhered to the inner wall of the processing chamber and a substrate supporting tool disposed in the processing chamber. If a film is deposited on the inside of the processing chamber to a large thickness, the film may crack due to increasing stresses, and thus contaminants (such as adhered materials that were stripped from the inside of the processing chamber) may be generated. If such contaminants permeate the conductive film or insulating film formed on the substrate, the product process yield may be decreased. Therefore, each time the thickness of a film formed by deposited materials reaches a predetermined value, it is necessary to remove the film. For this, it is preferable that deposited materials are removed by etching them using a cleaning gas without disassembling the processing chamber. If a film can be removed by a cleaning gas, since it is not necessary to disassemble the processing chamber, manpower can be saved, and breakage of processing chamber components can be prevented. Therefore, operational costs can be reduced, and the operating rate of an apparatus can be improved. For example, Patent Document 1 below discloses etching technology of a film such as an insulating film by using $BCl_3$.

[Patent Document 1] Japanese Unexamined Patent Application Publication No. 2004-146787

When an aluminum nitride film is formed on a substrate as a conductive film, for example, trimethylaluminum (TMA, $Al(CH_3)_3$) may be used as an aluminum (Al)-containing source, and ammonia ($NH_3$) may be used a nitriding gas. An aluminum nitride film is used as an insulating film, and by stacked an aluminum nitride film on a titanium (TiN) film in an alternating manner, the aluminum nitride film can be used for forming an electrode.

However, if an aluminum nitride film is etched by using $BCl_3$ (halogen-base gas) as a cleaning gas, the aluminum nitride film is not sufficiently etched so that it is difficult to remove the aluminum nitride film completely.

SUMMARY OF THE INVENTION

An object of the present invention is to provide a method of manufacturing a semiconductor device, a cleaning method, and a substrate processing apparatus, by which a conductive film or insulating film can be efficiently removed.

According to an aspect of the present invention, there is provided a method of manufacturing a semiconductor device, the method comprising:

(a) loading a substrate into a processing chamber;

(b) forming a conductive film or an insulating film on the substrate by alternately supplying a plurality of source gases into the processing chamber;

(c) unloading the substrate from the processing chamber;

(d) modifying a conductive film or an insulating film adhered to the processing chamber into an oxide film by oxidizing the conductive film or the insulating film adhered to the processing chamber by supplying a modifying gas into the processing chamber; and (e) removing the oxide film by supplying a cleaning gas into the processing chamber after performing a cycle of the steps (a), (b), (c) and (d) a plurality of times.

According to another aspect of the present invention, there is provided a cleaning method for removing a film adhered to a processing chamber of a substrate processing apparatus configured to process a substrate by supplying a source gas, the cleaning method comprising:

(a) modifying the film adhered to the processing chamber into an oxide film by oxidizing the film adhered to the processing chamber by supplying a modifying gas into the processing chamber each time a film is formed on the substrate; and (b) removing the oxide film by alternately repeating supplying a cleaning gas into the processing chamber and exhausting the cleaning gas from the processing chamber.

According to another aspect of the present invention, there is provided a substrate processing apparatus comprising:

a processing chamber configured to accommodate a substrate;

a source gas supply system configured to supply a plurality of source gases into the processing chamber;

an oxygen-containing gas supply system configured to supply an oxygen-containing gas into the processing chamber;

a cleaning gas supply system configured to supply a cleaning gas into the processing chamber;

an exhaust system configured to exhaust the processing chamber; and a control unit, wherein the control unit is configured to control the source gas supply system, the oxygen-containing gas supply system, the cleaning gas supply system, and the exhaust system, so as to: form a nitride film on the substrate by supplying the plurality of source gases into the processing chamber; modify a nitride film adhered to the processing chamber into an oxide film by oxidizing the nitride film by supplying the oxygen-containing gas into the processing chamber; and remove the oxide film by supplying the cleaning gas into the processing chamber.

BRIEF DESCRIPTION OF THE DRAWINGS

FIG. 1A through FIG. 1C are schematic views illustrating an etching mechanism according to an embodiment of the present invention.

DETAILED DESCRIPTION OF THE PREFERRED EMBODIMENTS

Figure 2A:
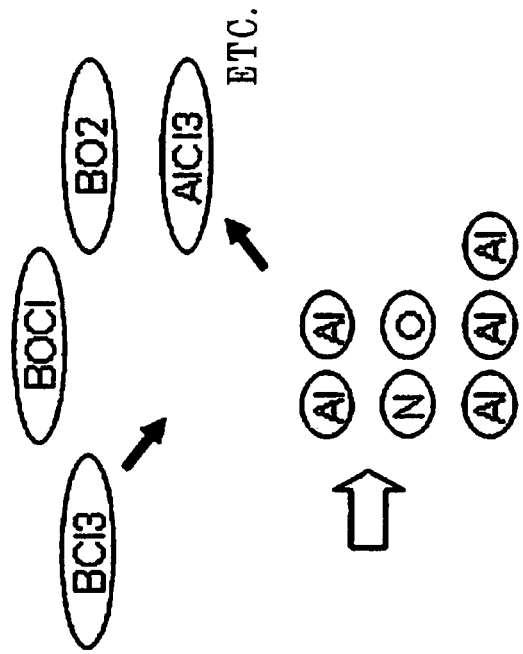
FIG. 2A through FIG. 2C are schematic views illustrating an etching mechanism according to an embodiment of the present invention.

Hereinafter, with reference to the attached drawings, an explanation will be given on a cleaning method according to preferred embodiments of the present invention. Since the cleaning method of the current embodiment is performed by using an etching phenomenon, the terms "etching" and "cleaning" have similar meanings in the present invention.

<Etching Principle>

What is first considered is the reason why an aluminum nitride film is not sufficiently etched by $BCl_3$. Since a large amount of activation energy is necessary to break an Al—N bond, the Al—N bond may not be broken if the Al—N bond is attacked only by boron (B) and chlorine (Cl) generating from $BCl_3$. Although it is also caused by a process temperature of a processing chamber, it may be impossible to perform etching at about 600° C. If the process temperature is greatly increased, although etching can be sufficiently performed even by using $BCl_3$, it is difficult to apply this method to a vertical apparatus requiring a low process temperature.

In the case of cleaning an oxide film (such as $HfO_2$, $ZrO_2$, $TiO_2$), it is known that the oxide film can be removed by using $BCl_3$. Therefore, in the present invention, an aluminum nitride film is modified into an aluminum oxide film by oxidizing the aluminum nitride film, and then the aluminum oxide film is cleaned. In addition, for improving the cleaning efficiency, it is effective to repeat, predetermined times, an oxidizing process for changing to an aluminum oxide film and a process of cleaning the aluminum oxide film.

To oxidize an aluminum nitride film, an oxidant such as $O_2$, No, $O_3$, $H_2O$, and $H_2+O_2$ may be used.

An aluminum nitride film is easily oxidized by $O_2$, and generally, a process temperature of 800° C. or higher is necessary. This may be due to high activation energy necessary to break an Al—N bond, and the Al—N bond may not be broken if the Al—N bond is attacked by only $O_2$ or O. A $H_2O$ oxidation method, in which wafer vapor or $H_2+O_2$ is supplied into a processing chamber 201 to generate $H_2O$ in the processing chamber 201, may be effective in that an aluminum nitride film can be oxidized at a relatively low temperature. Low-temperature oxidation is possible by using $H_2O$, and the reason for this may be because OH of $H_2O$ reduces the activation energy necessary to break the Al—N bond.

As described above, the process temperature of a processing chamber necessary for oxidizing a film is varied according to the kind of an oxidant. For example, in the case of $H_2O$, the process temperature may be set to be in the range from 400° C. to 800° C., for example, 600° C.; in the case of $O_3$, the process temperature may be set to be in the range from 700° C. to 800° C., for example, 800° C.; and in the case of NO, the process temperature may be set to be in the range from 700° C. to 800° C., for example, 800° C. Furthermore, in the case where an aluminum nitride film is oxidized by using $H_2+O_2$, since it is considered that $H_2O$ is generated in a processing chamber, the process temperature may be set to be in the range from 400° C. to 800° C., for example, 600° C. like in the case of $H_2O$.

When an aluminum nitride film is modified into an aluminum oxide film by oxidation and the aluminum oxide film is etched, a predicted etching mechanism of the aluminum oxide film will now be explained with reference to FIG. 1A through FIG. 1C and FIG. 2A through FIG. 2C. FIG. 1A through FIG. 1C are schematic views illustrating a predicted mechanism with micro-scale films, and FIG. 2A through FIG. 2C are schematic views illustrating the predicted mechanism in atomic scale.

Figure 2B:
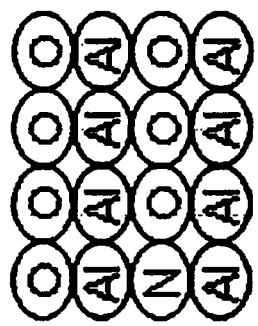
Figure 2C:
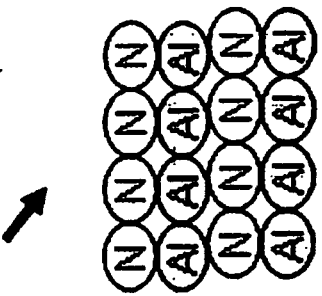

First, if an oxidant is supplied to an aluminum nitride film (FIG. 1A and FIG. 2A), the aluminum nitride film may be modified into an aluminum oxide film (FIG. 1B and FIG. 2B). Next, if $BCl_3$ is supplied to the aluminum oxide film as a cleaning gas, the aluminum oxide film may be etched while Al—O bonds are broken to produce substances such as BOCl, $BO_2$, and $AlCl_3$ (FIG. 1C and FIG. 2C).

When $BCl_3$ is supplied, the aluminum oxide film may be etched because Al—O bonds are broken by boron (B) generated from $BCl_3$. As a result of the etching process, compounds (reaction compounds) having Al—Cl bonds or B—O bonds may be generated. Here, a compound having Al—Cl bonds (such as $AlCl_3$) may be easily removed in a gaseous state owing its high vapor pressure.

However, although BCl$_3$ is supplied, it may be difficult to etch the aluminum nitride film because the activation energy necessary to break Al—N bonds is greater than the activation energy necessary to break Al—O bonds and the Al—N bonds are not broken by boron (B) generated from the BCl$_3$. The activation energy of an Al—N bond is as explained above. However, the bonding energy of an Al—N is lower than the bonding energy of an Al—O bond.

<Overall Structure of Apparatus>

Next, an explanation will be given on a usage of the above-described <etching principle> according to an embodiment of the present invention. That is, an explanation will be given on an exemplary substrate processing apparatus and a cleaning method thereof that use the above-described <etching principle>. The substrate processing apparatus of the current embodiment is configured as an example of a semiconductor manufacturing apparatus used in fabrication of a semiconductor device (integrated circuit (IC)). In the following description, an explanation will be given on the case of using a vertical batch type apparatus as an example of the substrate processing apparatus configured to perform a process such as a film forming process on a substrate. However, the present invention is not limited to the use of the vertical batch type apparatus. For example, the present invention can also be applied to other apparatuses such as a horizontal type apparatus or a single-wafer type apparatus.

Figure 3:
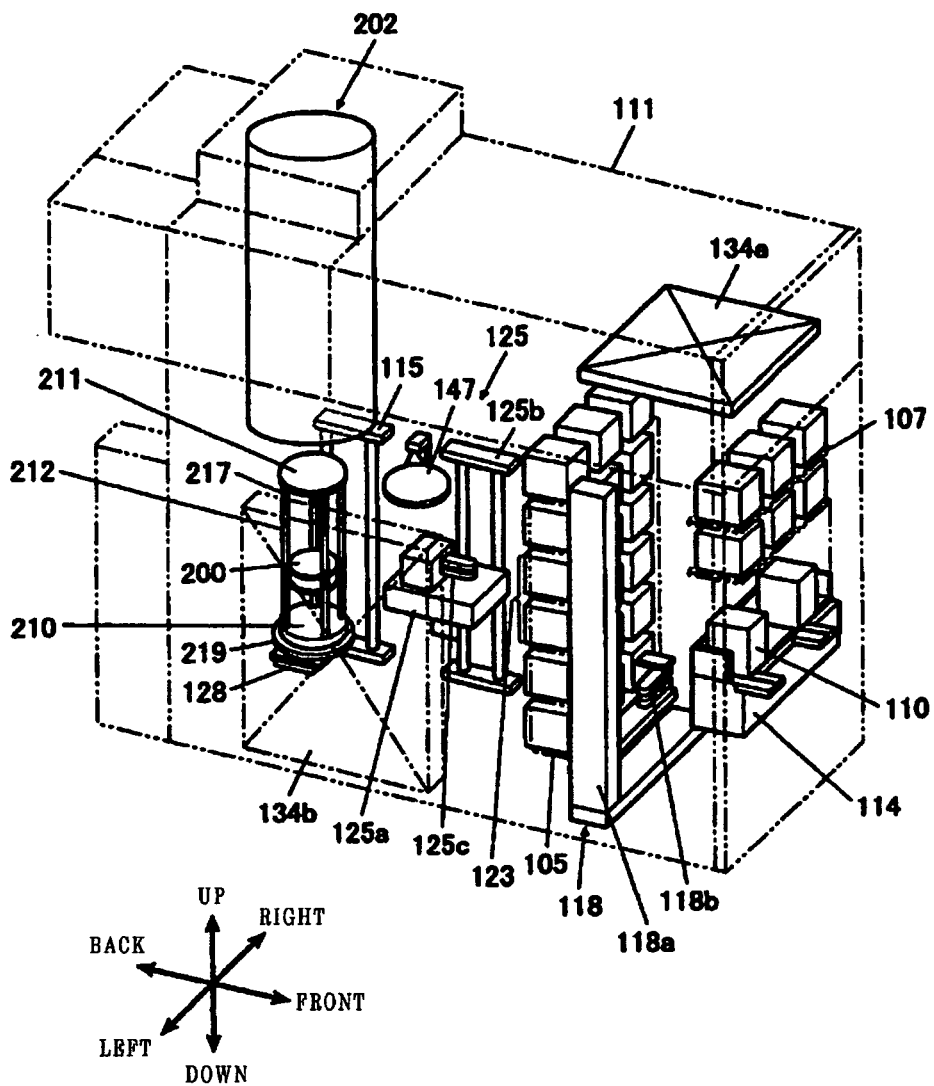
FIG. 3 is a schematic perspective view illustrating a substrate processing apparatus that can be properly used according to an embodiment of the present invention.

As shown in FIG. 3, in a substrate processing apparatus 101, cassettes 110 are used to accommodate substrates such as wafers 200. The wafers 200 are made of a material such as silicon. The substrate processing apparatus 101 includes a case 111. In the case 111, a cassette stage 114 is installed. The cassettes 110 are configured to be carried onto the cassette stage 114, or carried away from the cassette stage 114, by an in-process carrying device (not shown).

On the cassette stage 114, a cassette 110 is placed by the in-process carrying device in a manner such that wafers 200 are vertically positioned in the cassette 110 and a wafer entrance of the cassette 110 is pointed upward. The cassette stage 114 is configured so that the cassette 110 is rotated 90° counterclockwise in a longitudinal direction to the backward of the case 111 so as to horizontally orient the wafers 200 of the cassette 110 and point the wafer entrance of the cassette 110 to the backward of the case 111.

Near the inner center part of the case 111 in a front-to-back direction, a cassette shelf 105 is installed. The cassette shelf 105 is configured to store a plurality of cassettes 110 in a plurality of stages and a plurality of rows.

At the cassette shelf 105, a transfer shelf 123 is installed to store cassettes 110 that are carrying objects of a wafer transfer mechanism 125.

At the upper side of the cassette stage 114, a standby cassette shelf 107 is installed. The standby cassette shelf 107 is configured to store standby cassettes 110.

Between the cassette stage 114 and the cassette shelf 105, a cassette carrying device 118 is installed. The cassette carrying device 118 includes a cassette elevator 118a capable of moving upward and downward while holding a cassette 110, and a cassette carrying mechanism 118b. The cassette carrying device 118 is configured to carry cassettes 110 among the cassette stage 114, the cassette shelf 105, and the standby cassette shelf 107 by continuous motions of the cassette elevator 118a and the cassette carrying mechanism 118b.

At the backside of the cassette shelf 105, the wafer transfer mechanism 125 is installed. The wafer transfer mechanism 125 includes a wafer transfer device 125a capable of rotating or linearly moving wafers 200 in a horizontal direction, and a wafer transfer device elevator 125b configured to move the wafer transfer device 125a upward and downward. At the wafer transfer device 125a, tweezers 125c are installed to pick up wafers 200. The wafer transfer mechanism 125 is configured such that wafers 200 can be placed on the tweezers 125c to charge the wafers 200 into a boat 217 or discharge the wafers 200 from the boat 217 by continuous motions of the wafer transfer device 125a and the wafer transfer device elevator 125b.

At the upside of the rear part of the case 111, a processing furnace 202 is installed to perform a heat treatment process on wafers 200, and the bottom side of the processing furnace 202 is configured to be opened and closed by a furnace port shutter 147.

At the downside of the processing furnace 202, a boat elevator 115 is installed to move the boat 217 upward to and downward from the processing furnace 202. An arm 128 is connected to an elevating table of the boat elevator 115. A seal cap 219 is horizontally installed on the arm 128. The seal cap 219 supports the boat 217 vertically, and is configured to seal the bottom side of the processing furnace 202.

The boat 217 includes a plurality of holding members and is configured to hold a plurality of wafers 200 (for example, about fifty to one hundred fifty wafers) horizontally in a state where the wafers 200 are vertically arranged with the centers of the wafers 200 being aligned.

At the upside of the cassette shelf 105, a cleaning unit 134a is installed to supply clean air as a purified atmosphere. The cleaning unit 134a includes a supply fan and a dust filter to supply clean air to the inside of the case 111.

At the left side end part of the case 111, another cleaning unit 134b is installed to supply clean air. The cleaning system 134b includes a supply fan and a dust filter to supply clean air to the surrounding areas of the wafer transfer device 125a, the boat 217, and the like. After flowing around the wafer transfer device 125a, the boat 217, and the like, the clean air is exhausted to the outside of the case 111.

<Operation of Substrate Processing Apparatus>

Next, a main operation of the substrate processing apparatus 101 will be described.

A cassette 110 is carried and placed on the cassette stage 114 by the in-process carrying device (not shown) in a state where wafers 200 inside the cassette 110 are vertically positioned and the wafer entrance of the cassette 110 is pointed upward. Thereafter, the cassette 110 is rotated counterclockwise by 90° in a longitudinal direction toward the backward of the case 111 by the cassette stage 114 so that the wafers 200 inside the cassette 110 are horizontally positioned and the wafer entrance of the cassette 110 is pointed to the backward of the case 111.

Then, the cassette 110 is automatically carried and placed by the cassette carrying device 118 to a specified shelf position of the cassette shelf 105 or the standby cassette shelf 107 where the cassette 110 is temporarily stored. Thereafter, the cassette 110 is transferred to the transfer shelf 123 from the cassette shelf 105 or the standby cassette shelf 107 by the cassette carrying device 118. Alternatively, the carry cassette 110 may be directly transferred to the transfer shelf 123 from the cassette stage 114.

After the cassette 110 is transferred to the transfer shelf 123, wafers 200 are picked up from the cassette 110 through the wafer entrance of the cassette 110 and are charged into the boat 217 by the tweezers 125c of the wafer transfer device 125a. After delivering the wafer 200 to the boat 217, the wafer transfer device 125a returns to the cassette 110 so as to charge the next wafers 200 into the boat 217.

After a predetermined number of wafers 200 are charged into the boat 217, the bottom side of the processing furnace 202 closed by the furnace port shutter 147 is opened by moving the furnace shutter 147. Subsequently, the boat 217 in which a group of wafers 200 is held is loaded into the processing furnace 202 by an ascending motion of the boat elevator 115, and the bottom side of the processing furnace 202 is closed by the seal cap 219.

After the loading, a predetermined treatment process is performed on the wafers 200 charged in the processing furnace 202. Thereafter, the wafers 200 and the cassette 110 are carried to the outside of the case 111 in a reverse sequence of the above.

<Structure of Processing Furnace>

Next, with reference to FIG. 4 and FIG. 5, the processing furnace 202 of the substrate processing apparatus 101 will be described.

Figure 4:
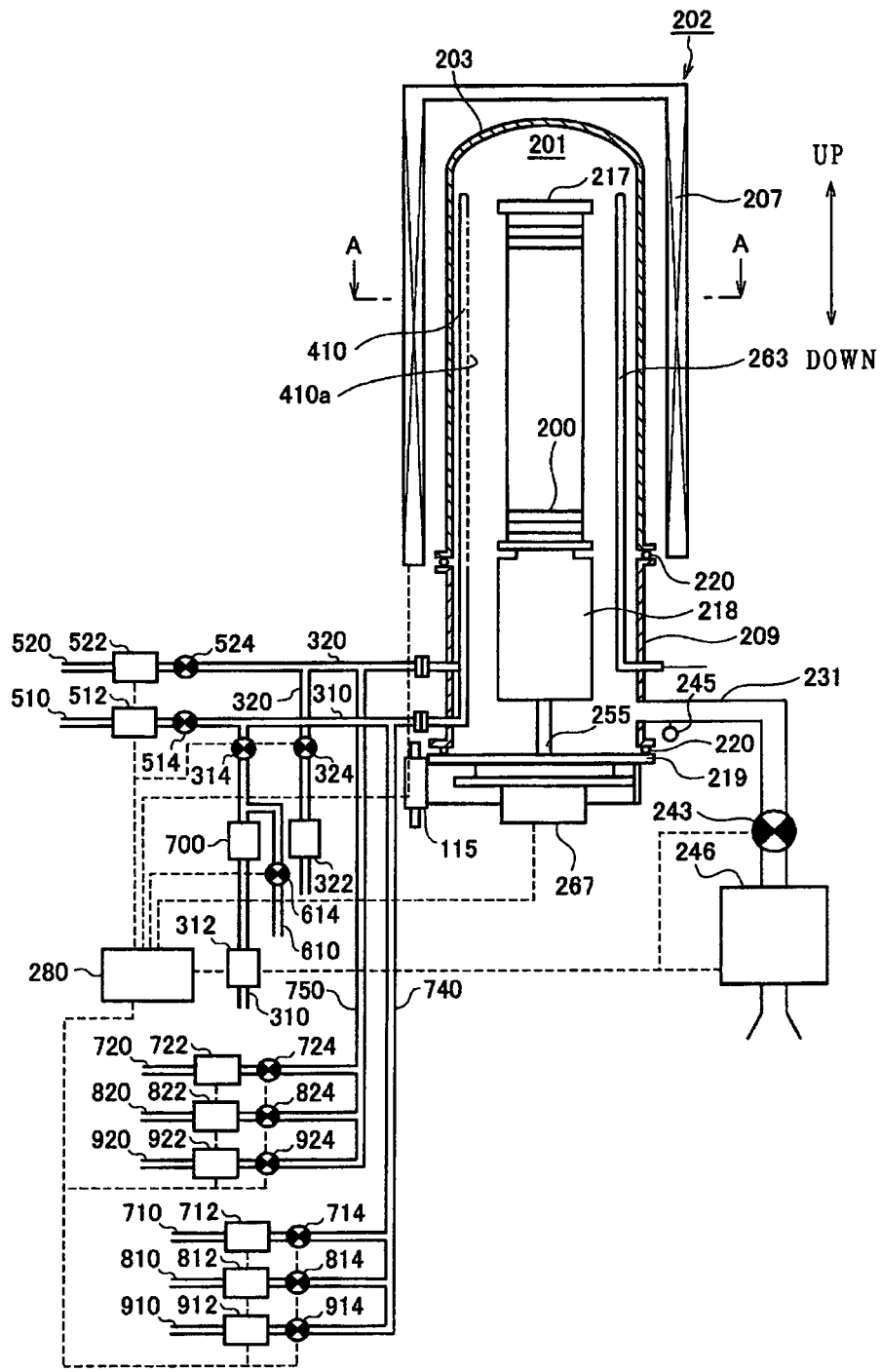
FIG. 4 is a schematic view illustrating a processing furnace and surrounding members that can be properly used according to an embodiment of the present invention, in which a vertical section of the processing furnace is illustrated.
Figure 5:
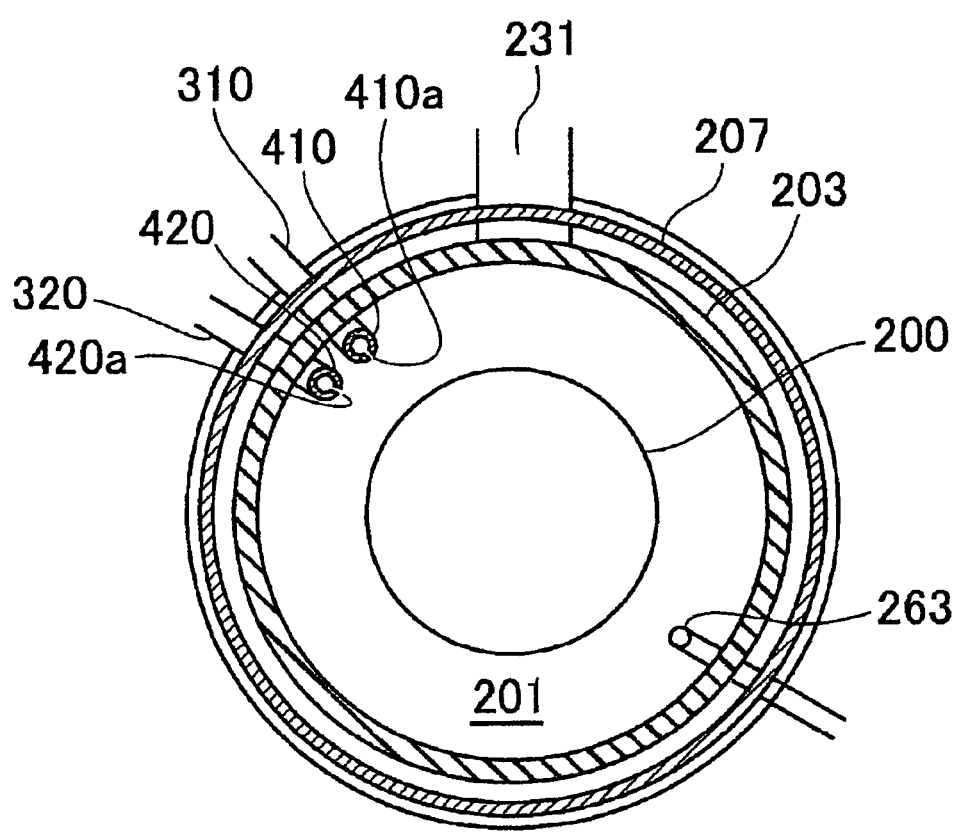
FIG. 5 is a sectional view taken along line A-A of the processing furnace of FIG. 4 that can be properly used according to an embodiment of the present invention.

As shown in FIG. 4 and FIG. 5, at the processing furnace 202, a heater 207 is installed as a heating device (heating unit) to heat wafers 200. The heater 207 includes an insulating member having a cylindrical shape with a closed top side, and a plurality of heating wires installed with respect to the insulating member to form a heating unit structure. Inside the heater 207, a reaction tube 203 made of quartz is installed to process wafers 200.

At the lower end of the reaction tube 203, a manifold 209 made of a material such as stainless steel is installed in a manner such that an O-ring 220 is disposed therebetween as a sealing member. A bottom opening of the manifold 209 is hermetically closed by a cover such as the seal cap 219 with a sealing member such as an O-ring 220 being disposed therebetween. That is, at the lower side of the reaction tube 203, the seal cap 219 is installed as a furnace port cover capable of hermetically closing a bottom opening of the reaction tube 203. The seal cap 219 is configured to make contact with the bottom side of the reaction tube 203 in a perpendicular direction from the lower side. The seal cap 219 is made of a metal such as stainless steel and has a circular disk shape. On the surface of the seal cap 219, the O-ring 220 is installed as a seal member configured to make contact with the bottom side of the reaction tube 203. In the processing furnace 202, the processing chamber 201 is formed by at least the reaction tube 203, the manifold 209, and the seal cap 219.

At a side of the seal cap 219 opposite to the processing chamber 201, a rotary mechanism 267 is installed to rotate the boat 217. A rotation shaft 255 of the rotary mechanism 267 penetrates the seal cap 219 and is connected to the boat 217 (described later) through a boat support 218 that supports the boat 217. By rotating the boat 217 with the rotary mechanism 267, wafers 200 can be rotated. The seal cap 219 is configured to be vertically moved by an elevating mechanism such as the boat elevator 115 installed outside the reaction tube 203, so that the boat 217 can be loaded into and unloaded from the processing chamber 201.

As shown in FIG. 3, the boat 217 includes a bottom plate 210 fixed to the boat support 218, a top plate 211 disposed at the top side of the boat 217, and a plurality of pillars 212 installed between the bottom plate 210 and the top plate 211. The boat 217 is configured to hold a plurality of wafers 200. The plurality of wafers 200 are supported by the pillars 212 of the boat 217 in a state where the wafers 200 are arranged at regular intervals and horizontally oriented.

At the above-described processing furnace 202, in a state where a plurality of wafers 200 to be batch-processed are piled in multiple states inside the boat 217, the boat 217 is inserted into the processing chamber 201 while being supported by the boat support 218, and then the heater 207 heats the wafers 200 inserted in the processing chamber 201 to a predetermined temperature.

As shown in FIG. 4 and FIG. 5, two gas supply pipes 310 and 320 (a first gas supply pipe 310 and a second gas supply pipe 320) are connected to the processing chamber 201 to supply a plurality of source gases (reaction gases), an inert gas, a modifying gas (oxidant), and a cleaning gas.

At the gas supply pipe 310, a flow rate control device (flow rate control unit) such as a mass flow controller 312, a vaporizing unit (vaporizing device) such as a vaporizer 700, and an on-off valve such as a valve 314 are installed sequentially from the upstream side of the gas supply pipe 310. The upstream end of a nozzle 410 (first nozzle 410) is connected to the leading end (downstream end) of the gas supply pipe 310. The nozzle 410 has an L-shape constituted by a vertical part and a horizontal part. The vertical part of the nozzle 410 extends in a vertical direction (stacked direction of wafers 200) in the arc-shaped space between the reaction tube 203 constituting the processing chamber 201 and the wafers 200 along the inner wall of the reaction tube 203. The horizontal part of the nozzle 410 is installed such that the horizontal part penetrates the side wall of the manifold 209. A plurality of gas supply holes 410a are formed in the lateral side of the nozzle 410 to supply a source gas through the gas supply holes 410a. The sizes of the gas supply holes 410a are equal or varied from the lower side to the upper side, and the gas supply holes 410a are arranged at the same pitch.

In addition, a vent line 610, which is connected to an exhaust pipe 231 (described later), is connected to the gas supply pipe 310 at a position between the vaporizer 700 and the valve 314. At the vent line 610, a valve 614 is installed. When a source gas is not supplied into the processing chamber 201, the source gas may be discharged to the vent line 610 through the valve 614 by opening the valve 614 in a state where the valves 314 and 324 are closed.

In addition, the downstream end of a carrier gas supply pipe 510 is connected to the downstream side of the valve 314 of the gas supply pipe 310 to supply an inert gas as a carrier gas. At the carrier gas supply pipe 510, a mass flow controller 512 and a valve 514 are installed sequentially from the upstream side of the carrier gas supply pipe 510.

In addition, the downstream end of a gas supply pipe 740 is connected to the gas supply pipe 310 at a position closer to the processing chamber 201 than a joint part between the carrier gas supply pipe 510 and the gas supply pipe 310. The downstream end of a gas supply pipe 710, the downstream end of a gas supply pipe 810, and the downstream end of a gas supply pipe 910 are connected to the upstream side of the gas supply pipe 740. At the carrier gas supply pipe 710, a mass flow controller 712 and a valve 714 are installed sequentially from the upstream side of the carrier gas supply pipe 710. At the carrier gas supply pipe 810, a mass flow controller 812 and a valve 814 are installed sequentially from the upstream side of the carrier gas supply pipe 810. At the carrier gas supply pipe 910, a mass flow controller 912 and a valve 914 are installed sequentially from the upstream side of the carrier gas supply pipe 910.

At the gas supply pipe 320, a flow rate control device (flow rate control unit) such as a mass flow controller 322, and a valve 324 are installed sequentially from the upstream side of the gas supply pipe 320. The upstream end of a nozzle 420 (second nozzle 420) is connected to the leading end (downstream end) of the gas supply pipe 320. The nozzle 420 has an L-shape constituted by a vertical part and a horizontal part. Like the vertical part of the nozzle 410, the vertical part of the nozzle 420 extends in a vertical direction (stacked direction of wafers 200) in the arc-shaped space between the reaction tube 203 constituting the processing chamber 201 and the wafers 200 along the inner wall of the reaction tube 203. The horizontal part of the nozzle 420 is installed such that the horizontal part penetrates the side wall of the manifold 209. A plurality of gas supply holes 420a are formed in the lateral side of the nozzle 420 to supply a source gas through the gas supply holes 420a. Like the gas supply holes 410a, the sizes of the gas supply holes 420a are equal or varied from the lower side to the upper side, and the gas supply holes 420a are arranged at the same pitch.

In addition, the downstream end of a carrier gas supply pipe 520 is connected to the downstream side of the valve 324 of the gas supply pipe 320 to supply an inert gas as a carrier gas. At the carrier gas supply pipe 520, a mass flow controller 522 and a valve 524 are installed sequentially from the upstream side of the carrier gas supply pipe 520.

In addition, the downstream end of a gas supply pipe 750 is connected to the gas supply pipe 310 at a position closer to the processing chamber 201 than a joint part between the carrier gas supply pipe 520 and the gas supply pipe 3w0. The downstream end of a gas supply pipe 720, the downstream end of a gas supply pipe 820, and the downstream end of a gas supply pipe 920 are connected to the upstream side of the gas supply pipe 750. At the carrier gas supply pipe 720, a mass flow controller 722 and a valve 724 are installed sequentially from the upstream side of the carrier gas supply pipe 720. At the carrier gas supply pipe 820, a mass flow controller 822 and a valve 824 are installed sequentially from the upstream side of the carrier gas supply pipe 810. At the carrier gas supply pipe 920, a mass flow controller 922 and a valve 924 are installed sequentially from the upstream side of the carrier gas supply pipe 920.

For example, if a source supplied into the gas supply pipe 310 is liquid, the liquid source is supplied to the vaporizer 700 while controlling the flow rate of the liquid source by using the mass flow controller 312. A vaporized gas, which is a source gas (reaction gas) generated by vaporizing a liquid source at the vaporizer 700, flows to the downstream side of the gas supply pipe 310 through the valve 314 where the vaporized gas is mixed with a carrier gas supplied from the carrier gas supply pipe 510, and then the gas mixture is supplied into the processing chamber 201 through the nozzle 410. In addition, by controlling the valves 314 and 324, the vaporized gas which is a source gas (reaction gas) can be supplied into the processing chamber 201 either through the gas supply pipe 310 or the gas supply pipe 320 or both through the gas supply pipes 310 and 320. For example, if a source supplied from the gas supply pipe 310 is gas, the mass flow controller 312 may be replaced with a mass flow controller adapted to control the flow rate of gas, and the vaporizer 700 may be not used.

In the above-described structure, as an example of a source gas, an Al source (e.g., trimethylaluminum (TMA) or aluminum chloride ($AlCl_3$)), or a Ti source (e.g., titanium tetrachloride ($TiCl_4$), tetrakis(dimethylamido)titanium (TDMAT, $Ti[N(CH_3)_2]_4$), or tetrakis(diethylamino)titanium (TDEAT, $Ti[N(CH_2CH_3)_2]_4$)) may be introduced into the gas supply pipe 310. For example, as an example of a source gas (modifying gas), a nitriding agent such as ammonia ($NH_3$), nitrogen ($N_2$), nitrous oxide ($N_2O$), or monomethylhydrazine ($CH_6N_2$) may be introduced into the gas supply pipe 320.

In addition, an oxygen-containing (oxidant) such as $O_2$ is intruded into the gas supply pipe 710 and the gas supply pipe 720 as a modifying gas. In addition, a reducing agent such as $H_2$ is intruded into the gas supply pipe 810 and the gas supply pipe 820 to add the reducing agent into a modifying gas. Each of $O_2$ and H2 flows through the gas supply pipe 740 and the gas supply pipe 750 toward the gas supply pipe 310 and the gas supply pipe 320, and is then supplied into the processing chamber 201 from the gas supply pipe 310 and the gas supply pipe 320 through the nozzle 410 and the nozzle 420. Instead of using $O_2$, for example, $O_3$, $H_2O$, $H_2+O_2$, $CO_X$, $SO_X$, $N_XO$ (where x denotes an integer greater than 1), or a gas mixture thereof may be used as an oxidant. If it is not necessary to add $H_2$ gas to a modifying gas, the gas supply pipes 810 and 820 may not be used. In addition, only one of the gas supply pipes 710 and 720 may be used.

Although various materials may be used as a modifying gas (oxidant), it may be preferable to use $H_2O$ as a modifying gas because an etching target film (for example, aluminum nitride film) (described later) can be easily oxidized. In addition, a device such as an ionizer is not necessary, and thus costs can be reduced. In addition, like in the current embodiment, it may be more preferable to use a mixture gas prepared by adding $H_2$ to $O_2$. In this case, as compared with the case where $H_2O$ gas is generated by bubbling, a larger amount of moisture can be supplied into the processing chamber 201, and thus oxidizing power can be increased. Although $O_3$ may be used because it has a great oxidizing power, an ozonizer is additionally required. Although the oxidizing rate may be reduced if $O_2$ (elemental substance) is used as compared with the case of using $H_2O$ or $O_3$, $O_2$ may be used.

A cleaning gas (etching gas) is introduced into the gas supply pipe 910 and the gas supply pipe 920 from the upstream sides thereof. The cleaning gas flows through the gas supply pipe 740 and the gas supply pipe 750 toward the gas supply pipe 310 and the gas supply pipe 320, and is then supplied into the processing chamber 201 from the gas supply pipe 310 and the gas supply pipe 320 through the nozzle 410 and the nozzle 420.

Preferably, a gas containing a compound having an energy level higher than the activation energy (for example, the activation energy of an A—O bond) of a component of an etching target film (for example, an aluminum oxide film obtained by modifying a aluminum nitride film) (described later) may be used as a cleaning gas. In addition, preferably, a gas, which reacts with an etching target film and produces a metal compound that can be easily removed as a gas owing to its high vapor pressure, may be used as a cleaning gas. For example, a halogen-based gas containing boron (B) such as $BCl_3$, HCl, $Cl_2$, $SiCl_4$, HBr, $BBr_3$, $SiBr_4$, $Br_2$, or a mixture gas thereof may be preferably used as a cleaning gas. Since a fluorine (F)-containing gas produces a metal compound (such as $AlF_3$) having a low vapor pressure (difficult to be removed as a gas) if the fluorine (F)-containing gas reacts with an etching target film, the fluorine (F)-containing gas is not preferable as a cleaning gas.

Examples of halides that can be used as a cleaning gas and properties of the halides are shown in Table 1 below. In addition, examples of Ti halides and Al halides that can be produced by etching reaction, and properties of the halides are shown in Table 2 below.

TABLE 1

| | Examples of cleaning gas (Halides containing boron (B)) | | |
|---|---|---|---|
| Materials | $BCl_3$ | $BBr_3$ | $BI_3$ |
| Phase at 25° C. | Gas | Liquid | Solid |
| Melting point (° C.) | −107.3 | −40 | 50 |
| Boiling point (° C.) | 12.6 | 91 | 210 |
| Main vapor pressure (Torr) | | | 5.3 (63.4° C.) |

TABLE 2

| | Ti halides | | | Al halides | | |
|---|---|---|---|---|---|---|
| Materials | $TiCl_4$ | $TiBr_4$ | $TiI_4$ | $AlCl_3$ | $AlBr_3$ | $AlI_3$ |
| Phase at 25° C. | Liquid | Solid | Solid | Solid | Solid | Solid |
| Melting point (° C.) | −25 | 39 | 150 | 192.6 (2.5 Atm.) | 97.5 | 191 |
| Boiling point (° C.) | 136.5 | 230 | 377 | 180 (Sublimation) | 255 | 360 |
| Main vapor pressure(Torr) | | | | 7 (120° C.) 90 (150° C.) | 1 (81.3° C.) 150 (190° C.) | 1 (178° C.) |

As shown in Table 1, any one of $BCl_3$, $BBr_3$, and $BI_3$ may be preferably used as a cleaning gas when their melting points and boiling points are considered. However, since it is necessary to heat $BI_3$ for vaporizing $Bi_3$, $BCl_3$ and $BBr_3$ may be more preferable as a cleaning gas. Although $BBr_3$ is liquid at normal temperature, since the vapor pressure of $BBr_3$ is high, $BBr_3$ may be used as a cleaning gas.

For example, if a titanium oxide film is etched with $BCl_3$, a halide such as $TiCl_3$, $TiBr_4$, and $TiI_4$ shown in Table 2 are generated as a reaction product. It is considered that $TiBr_4$ has a vapor pressure similar to that of $AlCl_3$, and thus $TiBr_4$ may be easily removed as a gas. For example, if an aluminum oxide film is etched with $BCl_3$, a halide such as $AlCl_3$, $AlBr_3$, and $AlI_3$ are generated as a reaction product. It is considered that $AlBR_3$ has a vapor pressure similar to that of $AlCl_3$, and thus $AlBr_3$ may be easily removed as a gas.

A TMA supply line is constituted mainly by the gas supply pipe 310, the mass flow controller 312, the vaporizer 700, the valve 314, the nozzle 410, and the gas supply holes 410a. In addition, a $NH_3$ supply line is constituted mainly by the gas supply pipe 320, the mass flow controller 322, the valve 324, the nozzle 420, and the gas supply holes 420a. In addition, a source gas supply system is constituted mainly by the TMA supply line and the $NH_3$ supply line to supply a plurality of source gases (for example, TMA and $NH_3$) into the processing chamber 201.

In addition, an inert gas supply system is constituted mainly by the carrier gas supply pipe 510, the mass flow controller 512, the valve 514, the gas supply pipe 310, the nozzle 410, the gas supply holes 410a, the carrier gas supply pipe 520, the mass flow controller 522, the valve 524, the gas supply pipe 320, the nozzle 420, and the gas supply holes 420a, so as to supply an inert gas into the processing chamber 201 as a carrier gas or a purge gas.

In addition, an oxygen-containing gas supply system, which supplies an oxygen-containing gas (oxidant) into the processing chamber 201 as a modifying gas, is constituted mainly by the gas supply pipe 710, the mass flow controller 712, the valve 714, the gas supply pipe 810, the mass flow controller 812, the valve 814, the gas supply pipe 740, the gas supply pipe 310, the nozzle 410, the gas supply holes 410a, the gas supply pipe 720, the mass flow controller 722 the valve 724, the gas supply pipe 820, the mass flow controller 822, the valve 824, the gas supply pipe 750, the gas supply pipe 320, the nozzle 420, and the gas supply holes 420a.

In addition, a cleaning gas supply system, which supplies a cleaning gas into the processing chamber 201, is constituted mainly by the gas supply pipe 910, the mass flow controller 912, the valve 914, the gas supply pipe 740, the gas supply pipe 310, the nozzle 410, the gas supply holes 410a, the gas supply pipe 920, the mass flow controller 922, the valve 924, the gas supply pipe 750, the gas supply pipe 320, the nozzle 420, and the gas supply holes 420a.

At the reaction tube 203, the exhaust pipe 231 is installed to exhaust the inside atmosphere of the processing chamber 201. A pressure sensor 245 which is a pressure detector (pressure detecting part) configured to detect the inside pressure of the processing chamber 201, an auto pressure controller (APC) valve 243 which is a pressure regulator (pressure regulating part), and a vacuum pump 246 which is a vacuum exhaust device are sequentially installed from the upstream side of the exhaust pipe 231. By operating the vacuum pump 246 and controlling the degree of opening of the APC valve 243 based on pressure information detected by the pressure sensor 245, the inside of the processing chamber 201 can be vacuum-evacuated to a predetermined pressure (vacuum degree).

The APC valve 243 is an on-off valve, which can be opened and closed to start and stop vacuum evacuation of the inside of the processing chamber 201 and can be adjusted in degree of valve opening for pressure adjustment. An exhaust system is constituted mainly by the exhaust pipe 231, the APC valve 243, the vacuum pump 246, and the pressure sensor 245.

At the reaction tube 203, a temperature sensor 263 is installed as a temperature detector. By controlling power supplied to the heater 207 based on temperature information detected by the temperature sensor 263, desired temperature distribution can be obtained in the processing chamber 201. Like the nozzles 410 and 420, the temperature sensor 263 has an L-shape and is disposed along the inner wall of the reaction tube 203.

At the center part inside the reaction tube 203, the boat 217 is installed. As described above, the boat 217 is configured to be loaded into and unloaded from the reaction tube 203 by raising and lowering the seal cap 219 with the boat elevator 115. In addition, as described above, the rotation shaft 255 of the (boat) rotary mechanism 267 is connected to the bottom side of the boat support 218 that supports the boat 217, so as to improve processing uniformity by rotating the boat 217. By operating the boat rotary mechanism 267, the boat 217 supported by the boat support 218 can be rotated.

A controller 280 is connected to the above-described members such as the mass flow controllers 312, 322, 332, 512, 522, 712, 722, 812, 822, 912, and 922; the valves 314, 324, 514, 524, 614, 714, 814, 824, 914, and 924; the heater 207; the vacuum pump 246; the APC valve 243; the rotary mechanism 267; the boat elevator 115, the pressure sensor 245; and the temperature sensor 263. The controller 280 is an example of a control unit (control device) used to control overall operations of the substrate processing apparatus 101. For example, the controller 280 controls operations such as flow rate adjusting operations of the mass flow controllers 312, 322, 512, 522, 712, 722, 812, 822, 912, and 922; opening and closing operations of the valves 314, 324, 514, 524, 614, 714, 724, 814, 824, 914, and 924; opening and closing operations of the APC valve 243 and a pressure adjusting operation of the APC valve 243 based on pressure information detected by the pressure sensor 245; a temperature adjusting operation of the heater 207 based on temperature information detected by the temperature sensor 263; start and stop operations of the vacuum pump 246; a rotation speed adjusting operation of the boat rotary mechanism 267; and an elevating operation of the boat elevator 115.

[First Embodiment]

<Film Forming Method, Film Modifying Method, and Cleaning Method>

Next, explanations will be given on a method of forming conductive films or insulating films on wafers 200 in the processing chamber 201, a method of modifying the films, and a method of cleaning the inside of the processing chamber 201 in one of semiconductor device manufacturing processes performed using the processing furnace 202 of the substrate processing apparatus 101. An explanation will be given on an exemplary film forming method, in which an aluminum source such as TMA is used as a film forming source and $NH_3$ is used as a nitriding agent so as to form aluminum nitride (AlN) films on wafers 200 by an atomic layer deposition (ALD) method. In addition, an explanation will be given on an exemplary cleaning method in which $BCl_3$ is used as a cleaning gas to clean the inside of the processing chamber 201 by thermal chemical reaction. In the following description, the controller 280 controls parts of the substrate processing apparatus 101.

(1) Film Forming Process

Figure 6:
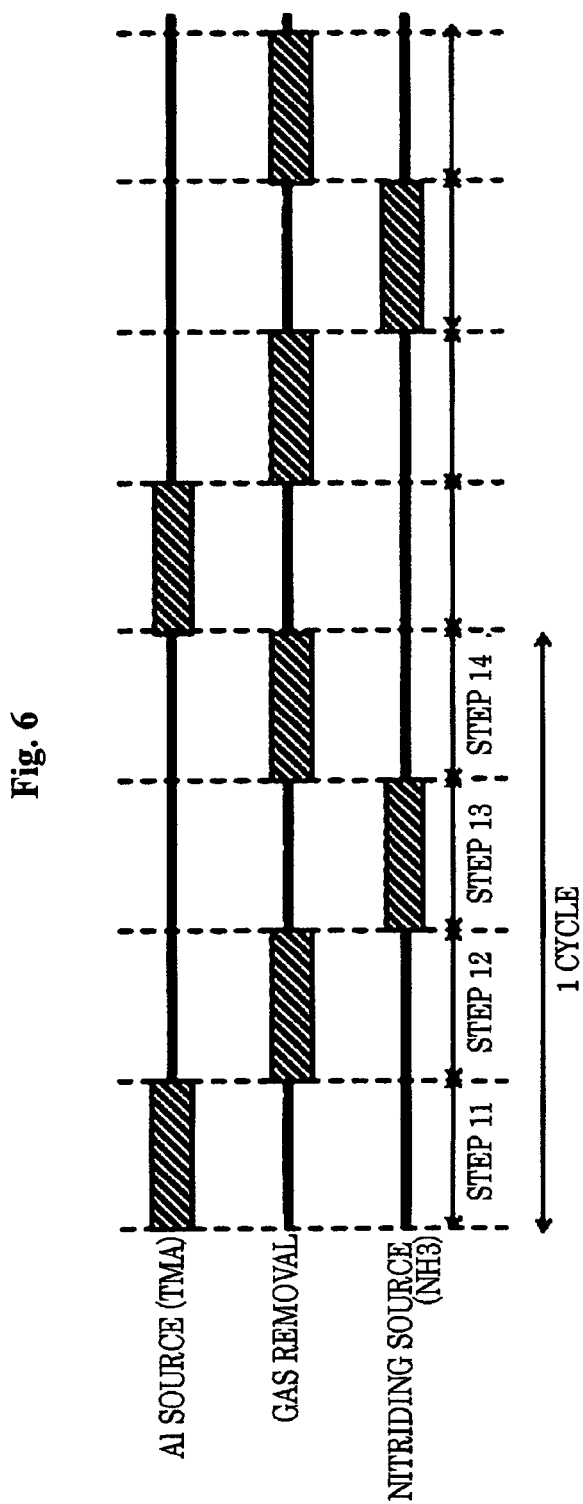
FIG. 6 is a view illustrating a film forming sequence according to an embodiment of the present invention.

First, an explanation will be given on a method of forming aluminum nitride films on wafers 200 in the processing chamber 201, with reference to FIG. 6 and FIG. 7. In the current embodiment, an explanation will be given on an exemplary method of forming films on substrates by an ALD method. In an ALD method, at least two kinds of source gases which are film forming sources are alternately supplied to a substrate under predetermined film forming conditions (temperature, time, etc.), so as to allow the process gases to be adsorbed on the substrate on an atomic layer basis for forming a film by surface reaction. In this time, the thickness of the film is controlled by adjusting the number of process gas supply cycles (for example, if the film-forming rate is 1 Å/cycle and it is intended to form a 20-Å film, the process is repeated for twenty cycles).

In a film forming process, the controller 280 controls the substrate processing apparatus 101 as follows. That is, the processing chamber 201 is controlled so as to keep the inside of the processing chamber 201 at 400° C. or lower, preferably, at 350° C. Thereafter, a first process is performed to load wafers 200 into the processing chamber 201. That is, a plurality of wafers 200 are charged into the boat 217, and the boat 217 is loaded into the processing chamber 201. Thereafter, the boat 217 is rotated by the boat rotary mechanism 267 to rotate the wafers 200. Then, the vacuum pump 246 is operated and the APC valve 243e is opened to evacuate the inside of the processing chamber 201, and if the temperature of the wafers 200 reaches 350° C. and processing conditions such as temperature become stable (pressure, temperature adjustment), the following four steps are sequentially performed while maintaining the inside temperature of the processing chamber 201 at 350° C. so as to form conductive films or insulating films on the wafers 200 (second process).

(Step 11)

In step 11 of the second process, TMA is supplied into the processing chamber 201. TMA is liquid at normal temperature. Thus, TMA may be supplied into the processing chamber 201 after vaporizing the TMA by heating the TMA or after vaporizing the TMA using the vaporizer 700. That is, in the latter case, inert gas such as helium (He), neon (Ne), argon (Ar), or nitrogen ($N_2$) may be supplied as a carrier gas so that it passes through a TMA container of the vaporizer 700, and then vaporized TMA may be supplied into the processing chamber 201 together with the carrier gas. In the following description, the latter case will be explained as an example.

TMA is supplied into the processing chamber 201 by supplying TMA to the gas supply pipe 310 and a carrier gas ($N_2$) to the carrier gas supply pipe 510. Then, the valve 314 of the gas supply pipe 310, the valve 514 of the carrier gas supply pipe 510, and the APC valve 243 of the exhaust pipe 231 are opened together. The carrier gas flows in the carrier gas supply pipe 510, and the flow rate of the carrier gas is controlled by the mass flow controllers 512. The TMA flows in the gas supply pipe 310 where the flow rate of the TMA is controlled by the mass flow controller 312 and the TMA is vaporized by the vaporizer 700, and then the TMA is mixed with the carrier gas the flow rate of which is controlled. Then, while the mixture is supplied into the processing chamber 201 through the gas supply holes 410a of the nozzle 410, the mixture is exhausted through the exhaust pipe 231. At this time, the APC valve 243 is properly controlled so as to keep the inside pressure of the processing chamber 201 at 10 Torr (about 1333 Pa) or lower, preferably, at 0.4 Torr (about 53 Pa). The wafers 200 are exposed to the TMA for 1 minute or shorter, for example, for 6 seconds.

At this time, gases flowing in the processing chamber 201 are TMA gas and inert gas such as $N_2$ or Ar gas but $NH_3$ gas does not exist in the processing chamber 201. Therefore, TMA does not participate in a gas phase reaction but reacts with the surfaces or underlayers of the wafers 200 (chemical adsorption) to form source (TMA) adsorption layers or Al layers (hereinafter also referred to as Al-containing layers). The TMA adsorption layer includes a discontinuous adsorption layer of source molecules as well as a continuous adsorption layer of source molecules. The Al layer includes a continuous layer formed of Al, and an Al thin film in which such continuous Al layers are superimposed on each other. In addition, a continuous layer formed of Al may also be called "an Al thin film."

At the same time, the valve 524 is opened to supply an inert gas through the carrier gas supply pipe 520 which is connected to the gas supply pipe 320. By this, TMA can be prevented from flowing to the gas supply pipe 320 from the processing chamber 201.

(Step 12)

In step 12 of the second process, the valve 314 of the gas supply pipe 310 is closed to stop supply of TMA into the processing chamber 201, and the valve 614 is opened so that TMA can flow to the vent line 610. In this way, supply of TMA into the processing chamber 201 is interrupted without stopping vaporization of TMA so that TMA can be supplied again rapidly and stably. At this time, the APC valve 243 of the gas exhaust pipe 231 is kept open, and the inside of the processing chamber 201 is exhausted to a pressure equal to or lower than 20 Pa by using the vacuum pump 246 so as to exhaust TMA remaining in the processing chamber 201. At this time, if inert gas such as $N_2$ is supplied into the processing chamber 201, the TMA can be removed more efficiently.

(Step 13)

In step 13 of the second process, $NH_3$ is supplied into the processing chamber 201. That is, $NH_3$ is supplied into the gas supply pipe 320, and a carrier gas ($N_2$) is supplied into the carrier gas supply pipe 520. Then, the valve 324 of the gas supply pipe 320, the valve 524 of the carrier gas supply pipe 520, and the APC valve 243 of the exhaust pipe 231 are opened together. The carrier gas flows in the carrier gas supply pipe 520, and the flow rate of the carrier gas is controlled by the mass flow controller 522. The $NH_3$ flows in the gas supply pipe 320 where the flow rate of the NH₃ is controlled by the mass flow controller 322, and then the NH₃ is mixed with the carrier gas the flow rate of which is controlled. Then, while the mixture is supplied into the processing chamber 201 through the gas supply holes 420a of the nozzle 420, the mixture is exhausted through the exhaust pipe 231. When the NH₃ flows, the inside pressure of the processing chamber 201 is kept at 10 Torr (about 1333 Pa) or lower, for example, at 7 Torr (about 933 Pa) by properly adjusting the APC valve 243. In addition, the supply flow rate of NH₃ is kept equal to or lower than 10 slm, preferably, at 7.5 slm. The wafers 200 are exposed to the NH₃ for 3 minutes or shorter, for example, for 45 seconds.

At the same time, the valve 514 is opened to supply an inert gas through the carrier gas supply pipe 510 which is connected to the gas supply pipe 310. By this, NH₃ can be prevented from flowing to the gas supply pipe 310 from the processing chamber 201.

By surface reaction (chemical adsorption) between the supplied NH₃ gas and the Al-containing layers chemically adsorbed on the wafers 200, aluminum oxide films are formed on the wafers 200.

(Step 14)

In step 14 of the second process, the valve 324 of the gas supply pipe 320 is closed to stop supply of NH₃ into the processing chamber 201. In addition, the APC valve 243 of the gas exhaust pipe 231 is kept open, and the inside of the processing chamber 201 is exhausted to a pressure equal to or lower than 20 Pa by using the vacuum pump 246 so as to exhaust NH₃ remaining in the processing chamber 201. In addition, at this time, if the inside of the processing chamber 201 is purged by supplying an inert gas such as N₂ into the processing chamber 201 through the gas supply pipe 320 constituting the NH₃ supply line and the gas supply pipe 310 constituting the TMA supply line, NH₃ remaining in the processing chamber 201 is removed more efficiently.

The steps 11 to 14 are set as one cycle, and the cycle is performed at least once to form aluminum nitride films on the wafers 200 to a predetermined thickness by an ALD method. In the above-described steps, it should be noted that the atmosphere formed by the Al-containing source gas in step 11 and the atmosphere formed by the nitriding gas in step 13 should not mixed with each other in the processing chamber 201 when films are formed.

After aluminum nitride films are formed to a predetermined thickness, the inside of the processing chamber 201 is vacuum-evacuated, and then an inert gas such as N₂ gas is supplied into the processing chamber 201 and exhausted from the processing chamber 201 so as to purge the inside of the processing chamber 201. When purging of the inside of the processing chamber 201 is finished, the inside atmosphere of the processing chamber 201 is replaced with the inert gas such as N₂, and the inside pressure of the processing chamber 201 returns to atmospheric pressure.

Thereafter, a third process is performed to unload the processed wafers 200 from the processing chamber 201. That is, the boat elevator 115 lowers the seal cap 219 to open the bottom side of the manifold 209 and unload the boat 217 in which the processed wafers 200 are held to the outside of the reaction tube 203 through the bottom side of the manifold 209 (boat unloading). Thereafter, the processed wafers 200 are discharged from the boat 217 (wafer discharging).

(2) Modifying Process

Next, an explanation will be given on a modifying process (fourth process) in which a modifying gas (oxidant) is supplied into the processing chamber 201 to modify conductive films or insulating films such as aluminum nitride films adhered to the inside of the processing chamber 201. As shown in FIG. 7, according to the current embodiment, each time the above-described film forming process (the first to third processes) is performed once, a modifying process is performed to modify aluminum nitride films adhered to the inside of the processing chamber 201. For example, an explanation will now be given on an exemplary modifying process in which aluminum nitride films adhered during the film forming process are oxidized with H₂ and O₂.

First, the boat 217, that is, the boat 217 in which wafers 200 are not charged, is lifted by using the boat elevator 115 to load the boat 217 into the processing chamber 201 (boat loading). In this state, the bottom side of the manifold 209 is sealed by the seal cap 219 with the O-ring 220 being disposed therebetween.

Next, the inside of the processing chamber 201 is vacuum-evacuated to a desired pressure (vacuum degree) by using the vacuum pump 246. At this time, the inside pressure of the processing chamber 201 is measured by the pressure sensor 245, and based on the measured pressure, the APC valve 243 is feedback-controlled. In addition, the inside of the processing chamber 201 is heated to a desired temperature by using the heater 207. At this time, to obtain desired temperature distribution inside the processing chamber 201, power to the heater 207 is feedback-controlled based on temperature information measured by the temperature sensor 263. Next, the boat 217 is rotated by the rotary mechanism 267. Alternatively, the boat 217 may not be rotated. The inside of the processing chamber 201 is kept at a temperature between 400° C. to 800° C., for example, at 600° C. If the inside temperature of the processing chamber 201 reaches 600° C. and conditions such as a temperature condition are stabilized, the next treatment is performed while keeping the inside of the processing chamber 201 at 600° C. In addition, the inside pressure of the processing chamber 201 is adjusted to 0.5 Torr to 760 Torr.

The valves 714, 724, 814, and 824 of the gas supply pipes 710, 720, 810, and 820 are opened to supply an oxygen-containing gas (oxidant) such as O₂ into the gas supply pipes 710 and 720 as a modifying gas, and a reducing agent such as H₂ into the gas supply pipes 810 and 820 to add the H₂ into the modifying gas. O₂ flows in the gas supply pipes 710 and 720 where the flow rates of the O₂ are controlled by the mass flow controllers 712 and 722, and then flows into the gas supply pipes 740 and 750. H₂ flows in the gas supply pipes 810 and 820 where the flow rates of the H₂ are controlled by the mass flow controllers 812 and 822, and then flows into the gas supply pipes 740 and 750. O₂ and H₂ flow in the gas supply pipes 740 and 750 toward the gas supply pipes 310 and 320, and is then supplied into the processing chamber 201 from the gas supply pipe 310 and the gas supply pipe 320 through the gas supply holes 410a and 420a of the nozzles 410 and 420. The controller 280 controls the mass flow controller 712 and the mass flow controller 722 to keep the flow rate of H₂ and O₂ in the range from 0.5 slm to 20 slm.

In the processing chamber 201, the H₂ and O₂ are mixed with each other and become H₂O, and aluminum nitride films adhered to the inner wall of the reaction tube 203 are oxidized by the H₂O so that the aluminum nitride films are modified into aluminum oxide films. The oxidizing power of an oxidant is affected by the temperature distribution in the processing chamber 201 and is low at relatively low temperature regions (such as a furnace port part). However, since the thicknesses of aluminum nitride films adhered in the low temperature regions are small, low oxidizing power may not cause a problem. That is, although the oxidizing power is decreased, aluminum nitride films may be sufficiently oxidized, and thus the aluminum nitride films may be modified into aluminum oxide film.

If the aluminum nitride films are sufficiently oxidized/modified into aluminum oxide films, the valves 714, 724, 814, and 824 of the gas supply pipes 710, 720, 810, and 820 are closed to stop supplies of $H_2$ and $O_2$. In addition, in a state where the APC valve 243 of the gas exhaust pipe 231 is kept open, the inside of the processing chamber 201 is exhausted to a pressure equal to or lower than 20 Pa by using the vacuum pump 246 so as to exhaust $H_2O$ remaining in the processing chamber 201. In addition, at this time, if the inside of the processing chamber 201 is purged by supplying an inert gas such as $N_2$ into the processing chamber 201 through the gas supply pipe 320 constituting the NH3 supply line and the gas supply pipe 310 constituting the TMA supply line, $H_2O$ remaining in the processing chamber 201 is removed more efficiently.

In this way, each time the film forming process (repetition of step 11 to step 14) is finished, aluminum nitride films adhered to the inner wall of the processing chamber 201 are oxidized. Therefore, when a cleaning process (described later) is performed, since films are already oxidized partially, the etching time of the films can be reduced.

(3) Cleaning Process

Next, an explanation will be given on a cleaning process (fifth process) in which a cleaning gas is supplied into the processing chamber 201 to remove deposited materials such as conductive films or insulating films adhered to the inside of the processing chamber 201. In the current embodiment, an explanation will now be given on an exemplary cleaning process in which the aluminum oxide films modified in the modifying process are cleaned with a cleaning gas such as $BCl_3$.

The valves 914 and 924 of the gas supply pipes 910 and 920 are opened to supply a cleaning gas into the gas supply pipes 910 and 920. In other words, a halogen-based gas such as $BCl_3$ is supplied as an etching gas. The flow rate of the $BCl_3$ is controlled by the mass flow controllers 912 and 922, and the $BCl_3$ flows from the gas supply pipes 910 and 920 to the gas supply pipes 740 and 750 to the gas supply pipes 310 and 320 where the $BCl_3$ is supplied into the processing chamber 201 through the gas supply holes 410a and 420a of the nozzles 410 and 420.

The etching gas may be used at a concentration of about 100% to about 20% by diluting the etching gas with an inert gas such as $N_2$. In this case, the valves 514 and 524 of the carrier gas supply pipes 510 and 520 are opened. The $N_2$ flows in the carrier gas supply pipes 510 and 520 where the flow rates of the $N_2$ are controlled by the mass flow controllers 512 and 522, and in the gas supply pipes 310 and 320, the $N_2$ is mixed with the etching gas the flow rate of which is controlled. Then, the mixture is supplied into the processing chamber 201 through the gas supply holes 410a and 420a of the nozzles 410 and 420.

At this time, supply of $BCl_3$ into the processing chamber 201 may be continuously carried out, or supply of $BCl_3$ may be intermittently (discontinuously) carried out so that supply of $BCl_3$ and exhaustion of $BCl_3$ to the exhaust pipe 231 can be alternately carried out. That is, the cleaning process may be performed by cyclic etching. That is, as shown in FIG. 7, the cleaning process may be performed by setting the following step 21 to step 24 as one cycle and performing the cycle predetermined times.

(Step 21)

In a state where the APC valve 243 is opened, the inside of the processing chamber 201 is vacuum-evacuated. After the inside pressure of the processing chamber 201 reaches a first pressure, the APC valve 243 is closed. In this way, the inside of the processing chamber 201 and the exhaust system are closed.

(Step 22)

In this state, that is, the APC valve 243 is closed and the inside pressure of the processing chamber 201 is kept at the first pressure, the valves 914 and 924 are opened to supply $BCl_3$ into the processing chamber 201 for a predetermined time. At this time, the valves 514 and 524 may be opened to supply an inert gas such as $N_2$ into the processing chamber 201 for diluting the etching gas ($BCl_3$). If the inside pressure of the processing chamber 201 reaches a second pressure, the valves 914 and 924 are closed to stop supply of $BCl_3$ into the processing chamber 201. At this time, if an inert gas such as $N_2$ is being supplied, the valves 514 and 524 are also closed to stop supply of the inert gas into the processing chamber 201. In this way, the gas supply system is closed. At this time, all the valves are closed. That is, both the gas supply system and the exhaust system are in a closed state. In this way, the inside of the processing chamber 201 is closed to confine the $BCl_3$ in the processing chamber 201.

(Step 23)

The processing chamber 201 is kept for a predetermined time in the state where the processing chamber 201 is closed by closing the gas supply system and the exhaust system to confine the $BCl_3$ in the processing chamber 201, (Step 24)

After the predetermined time, the APC valve 243 is opened, and the inside of the processing chamber 201 is vacuum-evacuated through the exhaust pipe 231. Thereafter, the valves 514 and 524 are opened to supply an inert gas such as $N_2$ into the processing chamber 201 while exhausting the inert gas through the exhaust pipe 231. In this way, the inside of the processing chamber 201 is purged by gas.

The above-described step 21 to step 24 are set as one cycle, and the cycle is performed predetermined times. In this way, cleaning is performed by cyclic etching. When cleaning is performed as described above, a step of closing the APC valve 243 for a predetermined time and a step of opening the APC valve 243 for a predetermined time are performed predetermined times. That is, intermittent (alternate) opening and closing of the APC valve 243 are carried out predetermined times. In the case where cleaning is performed by cyclic etching, the amount of etching can be controlled by previously checking the rate of etching per cycle and adjusting the execution number of cycles. In addition, gas consumption can be reduced as compared with a cleaning method in which an etching gas is continuously supplied.

The $BCl_3$ introduced into the processing chamber 201 diffuses throughout the inside of the processing chamber 201 and makes contact with materials deposited on the inside of the processing chamber 201. That is, the $BCl_3$ makes contact with deposited materials such as aluminum oxide films adhered to the boat 217 and the inner wall of the reaction tube 203. The aluminum oxide films may be etched away because boron (B) generating from the $BCl_3$ breaks Al—O bonds. At this time, there occurs thermal chemical reaction between the deposited materials and the $BCl_3$ to produce reaction products having Al—Cl bonds or B—O bonds such as $AlCl_3$. Since a compound having Al—Cl bonds has a high vapor pressure, the reaction products can be exhausted to the outside of the processing chamber 201 through the exhaust pipe 231. In this way, deposited materials are removed (etched) to clean the inside of the processing chamber 201.

After the cycle is performed predetermined times, the inside of the processing chamber 201 is vacuum-evacuated, and an inert gas such as $N_2$ is supplied into the processing chamber 201 and exhausted the inert gas from the processing chamber 201 so as to purge the inside of the processing chamber 201. When purging of the inside of the processing chamber 201 is finished, the inside atmosphere of the processing chamber 201 is replaced with the inert gas such as $N_2$.

Cleaning may be performed by cyclic etching under the following exemplary process conditions:
 Process temperature: 500° C. to 850° C.,
 First pressure: 1.33 Pa to 13300 Pa,
 Second pressure: 13.3 Pa to 66500 Pa, preferably, 13300 Pa to 26600 Pa, $BCl_3$ supply flow rate: 0.5 slm to 5 slm,
 Gas supply time (transition time): 0.1 min to 15 min,
 Gas confining time (confining time): 0.1 min to 15 min,
 Exhaust time: 0.1 min to 10 min, and
 Number of cycles: 1 to 100 times.

While maintaining the process conditions at constant values within the respective ranges, the cleaning may be performed.

After the inside of the processing chamber 201 is cleaned, the film forming process (the first to third processes) is performed again on wafers 200. That is, the boat 217 in which a plurality of wafers 200 are charged is loaded into the processing chamber 201, and the step 11 to step 14 are repeated to form aluminum nitride films on the wafers 200. Then, the boat 217 in which the processed wafers 200 are held is unloaded to the outside of the processing chamber 201. In addition, if necessary the above-described modifying process (fourth process) is performed again, and the above-described cleaning process (fifth process) is performed again to clean the inside of the reaction tube 203.

According to the current embodiment, the modifying process is performed before the cleaning process is performed to previously modify aluminum nitride films into aluminum oxide films. Since Al—O bonds can be easily broken by boron (B) generating from $BCl_3$, aluminum nitride films (aluminum oxide films after modification) can be surely etched. In addition, although a compound (reaction product) having Al—Cl bonds or B—O bonds is generated, the compound having Al—Cl bonds (for example, $AlCl_3$) has a high vapor pressure, and thus it can be easily removed as a gas.

Figure 7:
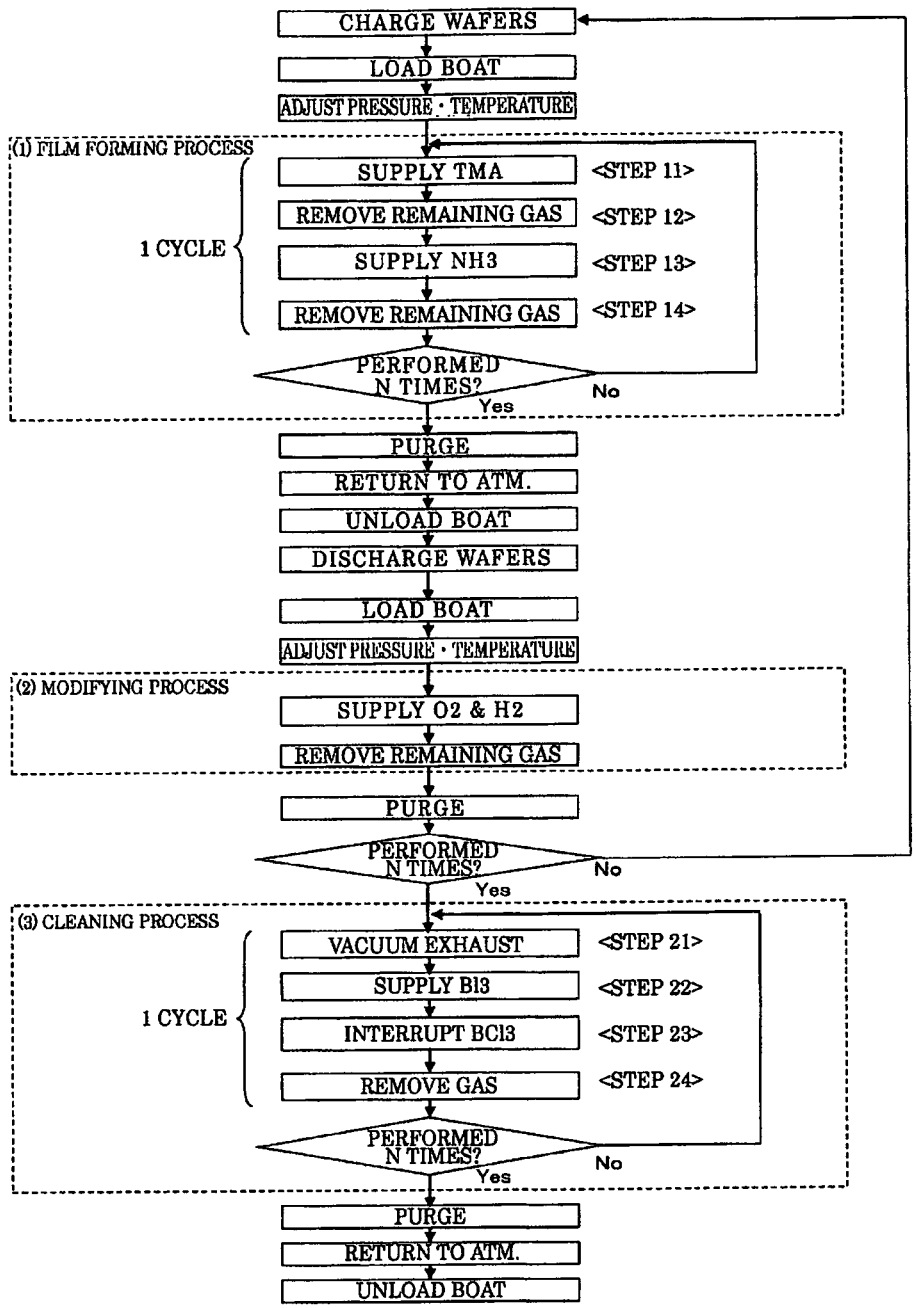
FIG. 7 is a view illustrating a sequence according to an embodiment of the present invention.

In addition, according to the current embodiment, after the film forming process (repetition of step 11 and step 14) is performed, the modifying process is performed as shown in FIG. 7. In this case, aluminum nitride films to be oxidized in the modifying process can have a small thickness, and thus the aluminum nitride films can be oxidized more surely. By reducing the thickness of an aluminum nitride film to be oxidized by one execution of the modifying process, the time necessary for oxidation can be reduced, and the oxidation rate can be increased (if the thickness of a film is large, an oxidant is difficult to diffuse into the film, and thus the oxidation rate decreases gradually). Therefore, in the cleaning process, aluminum nitride films (aluminum oxide films after modification) can be etched more surely.

Furthermore, in the current embodiment, after the modifying process but before the cleaning process, the inside of the processing chamber 201 is purged so that an oxidant does not remain in the processing chamber 201. Therefore, a cleaning gas may not be mixed with an oxidant, and thus corrosion of inner members of the processing chamber 201 or gas supply system can be surely prevented.

[Second Embodiment]

Figure 8:
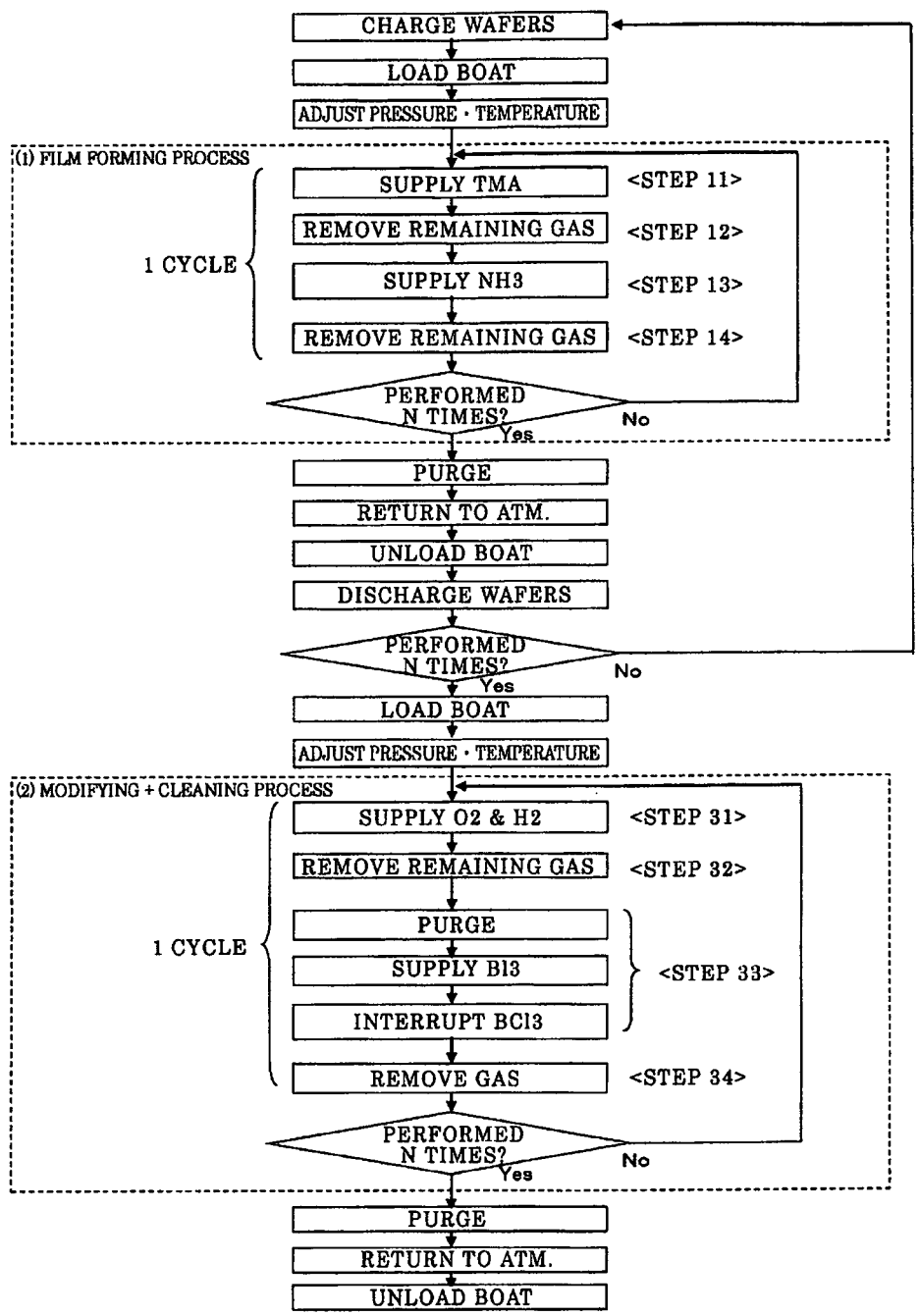
FIG. 8 is a view illustrating a sequence according to a second embodiment of the present invention.
Figure 9:
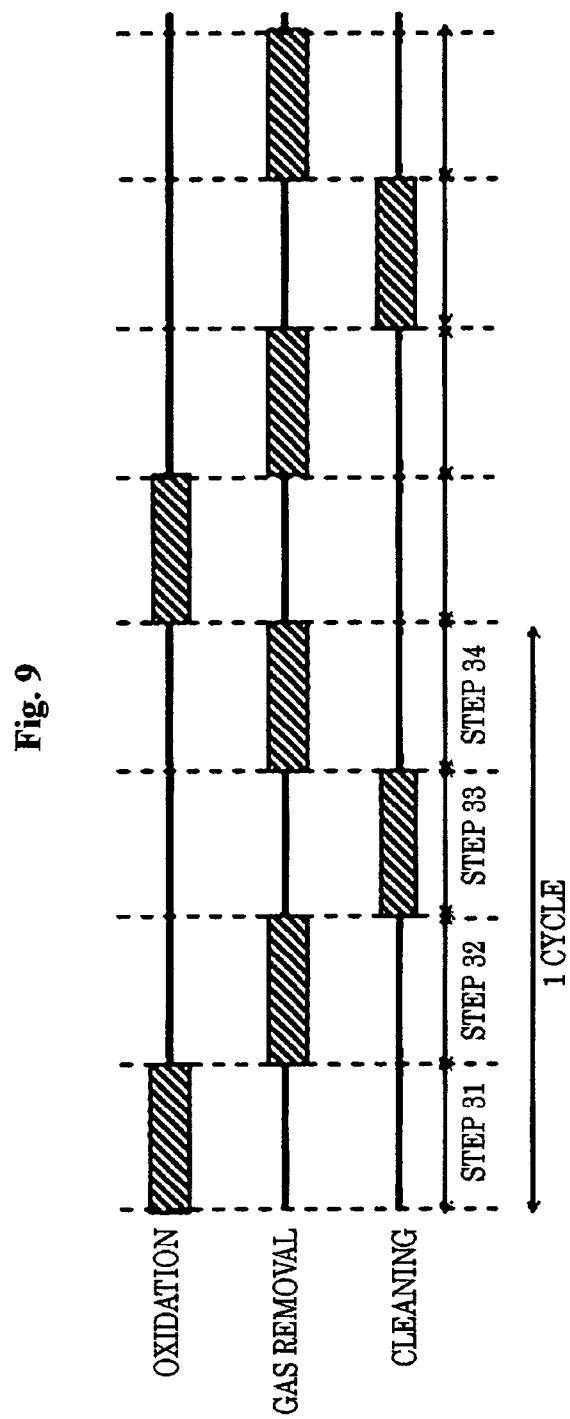
FIG. 9 is a view illustrating sequences of a modifying process and a cleaning process according to the second embodiment of the present invention.

In the description of the current embodiment, an explanation will be given on the different with the first embodiment. The current embodiment has the same film forming process as the first embodiment. In a modifying process and a cleaning process of the current embodiment, the same operations are performed as in the first embodiment. However, timings of the processes are different as shown in FIG. 8. In the current embodiment, after the film forming process is performed until aluminum nitride films to be etched are grown to a predetermined thickness, the modifying process and the cleaning process are consecutively performed. In addition, as shown in FIG. 8 and FIG. 9, instead of performing the modifying process and the cleaning process only once, the processes are repeated predetermined times.

In detail, if the thickness of aluminum nitride films adhered to the inside of the processing chamber 201 reaches a predetermined value after the film forming process (repetition of step 11 to step 14) is performed predetermined times, the boat 217 in which wafers 200 are not held is loaded into the processing chamber 201, and the inside pressure and temperature of the processing chamber 201 are adjusted. Then, the aluminum nitride films are partially oxidized (step 11), an oxidant is removed (step 12), aluminum oxide films formed by modification are etched with a cleaning gas (step 33), and the cleaning gas is removed from the processing chamber 201 (step 34). Then, a cycle of the steps 31 to 34 is performed predetermined times.

According to the current embodiment, overhead time necessary to perform the modifying process and the cleaning process (such as a time necessary to raise and lower the boat 217 and a time necessary to adjust pressure and temperature) can be largely reduced, and thus the productivity of a substrate processing process can be improved. In addition, according to the current embodiment, instead of performing the modifying process and the cleaning process once, the processes can be cyclically performed predetermined times to surely remove aluminum nitride films even when the thickness of the aluminum nitride films is great.

[Third Embodiment]

In the description of the current embodiment, an explanation will be given on the different with the first embodiment. The current embodiment has the same film forming process as the first embodiment. In a modifying process and a cleaning process of the current embodiment, the same operations are performed as in the first embodiment but timings of the processes are different. That is, in the first embodiment, the modifying process and the cleaning process are regularly performed. However, in the current embodiment, the modifying process and the cleaning process are irregularly performed. For example, the modifying process and the cleaning process may be performed during an idle time of a production (substrate processing) lot.

In this case, the controller 280 calculates an accumulated film thickness based on the execution number of the film forming process, and determines whether to perform the modifying process and the cleaning process based on the calculated film thickness. Alternatively, instead of calculating an accumulated film thickness, the controller 280 may receive information about an accumulated film thickness from a sensor (not shown) disposed in the processing chamber 201. Alternatively, instead of calculating an accumulated film thickness to make a decision, the controller 280 may make a decision based on the execution number of the film forming process. Process conditions for the modifying process and the cleaning process are determined based on an calculated film thickness by the controller 280. Alternatively, a plurality of recipes (for example, a recipe for the modifying process and the cleaning process in the case where the film forming process is performed 10 times, a recipe for the modifying process and the cleaning process in the case where the film forming process is performed 15 times, etc.) may be previously registered in a memory unit of the controller 280, and when the modifying process and the cleaning process are performed, the controller 280 may select and read a proper one of the registered recipes from the memory unit.

According to the current embodiment, the modifying process and the cleaning process are irregularly performed, for example, during an idle time of a production lot, so that the number of production halts can be reduced and time can be saved. In addition, since optimal process conditions (or recipe) can be selected based on the execution number of the film forming process, insufficient cleaning or over-cleaning can be prevented.

[Fourth Embodiment]

In the description of the current embodiment, an explanation will be given on the different with the second embodiment. In the current embodiment, a film forming process is performed until films are formed to a predetermined thickness. Then, a modifying process is performed only once, and a cleaning process is performed predetermined times.

Figure 10:
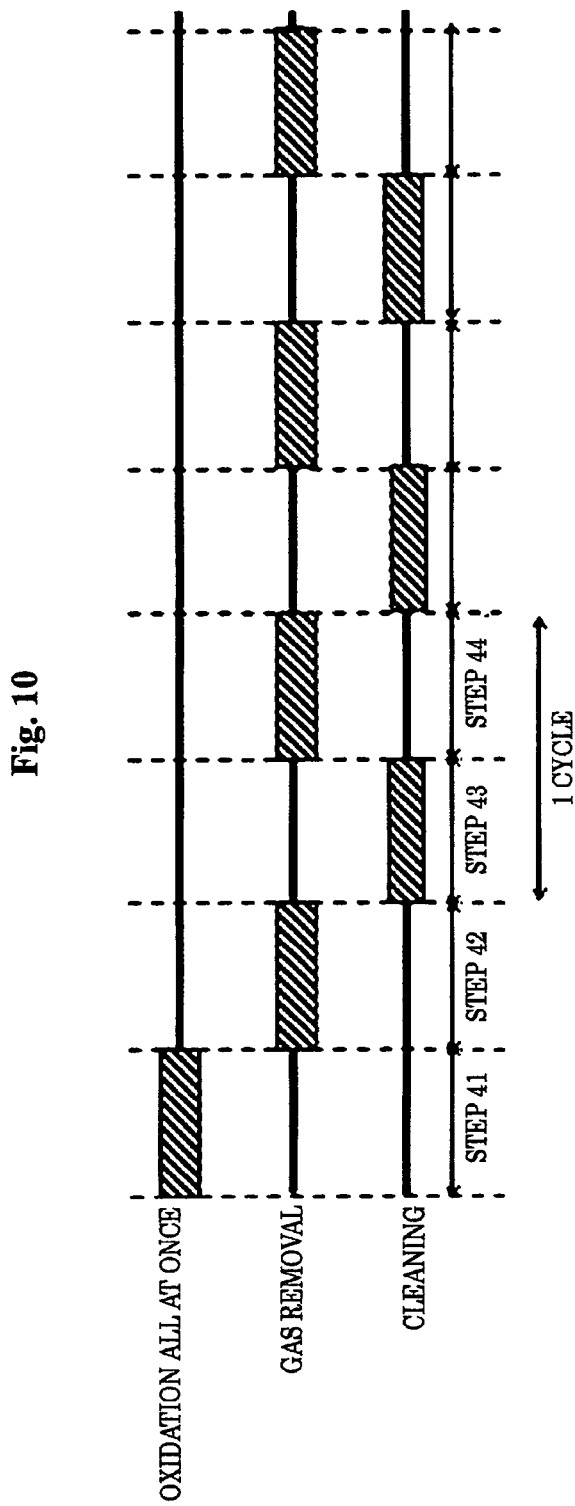
FIG. 10 is a view illustrating sequences of a modifying process and a cleaning process according to a fourth embodiment of the present invention.

In detail, as shown in FIG. 10, aluminum nitride films are oxidized (step 41), an oxidant is removed (step 42), a cleaning gas is supplied into the processing chamber 201 (step 43), and the cleaning gas is removed from the inside of the processing chamber 201 (step 44). The step 43 and step 44 are set as one cycle, and cleaning is carried out by performing the cycle predetermined times, so that films adhered to the inside of the reaction tube 203 can be removed. In the current embodiment, it is explained that the cleaning gas is intermittently supplied. However, the cleaning gas may be continuously supplied.

[Fifth Embodiment]

In the description of the current embodiment, an explanation will be given on the different with the first embodiment. In the current embodiment, instead of employing an oxidation method using an oxidant after one execution of a film foaming process, another method is used: the atmosphere is allowed to enter the inside of the processing chamber 201 when the boat 217 is loaded into the processing chamber 201 so that moisture and oxygen included in the atmosphere can react with films deposited on the inside of the reaction tube 203.

According to the above-described first to fifth embodiments, after a film forming process, films which is difficult to clean can be removed.

[Other Embodiments]

While the present invention has been particularly described with reference to the embodiments, the present invention is not limited to the embodiments, but various changes and modifications may be made in the present invention without departing from the scope of the invention.

The present invention is not limited to aluminum nitride films described in the above-described embodiments. For example, the present invention can be applied to any kind of film that cannot be removed by directly using a cleaning gas but can be removed as follows. After a film X that cannot be removed by directly using a cleaning gas is formed, the film X is oxidized, and a film Y formed by oxidizing the film X is removed by using a cleaning gas. That is, the present invention can be applied to any film that can couple with a component of a cleaning gas after the film is modified and produce a halide (reaction product) having a high vapor pressure. For example, the present invention can be used for etching nitride films such as an aluminum nitride (AlN) film, a titanium nitride (TiN) film, a titanium aluminum nitride (TiAlN) film, a titanium silicon nitride (TiSiN) film, a tantalum nitride (TaN) film, a tantalum silicon nitride (TaSiN) film, a boron nitride (BN) film, a hafnium nitride (HfN) film, a tungsten nitride (WN) film, and a silicon nitride (SiN). In addition, the present invention can be used for etching very thin films having different compositions and stacked in the form of a laminator, such as stacked films of a titanium nitride film and a an aluminum nitride film.

In addition, a source used in a film forming process is not limited to the kinds of gases described in the previous embodiments as long as a film formed in a film forming process (etch-target film) is a nitride film described above.

In addition, as well as the modifying gases described in the previous embodiments, any other gas may be used as a modifying gas as long as the bonding energy of elements of a film modified by the gas is smaller than the bonding energy between a component of a cleaning gas and an element of the modified film.

For example, a cleaning gas is not limited to $BCl_3$. Another gas such as HCl, $Cl_2$, $SiCl_4$, HBr, $BBr_3$, $SiBr_4$, and $Br_2$ may be used as a cleaning gas.

Furthermore, in the previous embodiments, after a modifying gas (oxidant) is supplied into the processing chamber 201 but before a cleaning process is started, the oxidant remaining in the processing chamber 201 is removed by a purge process. However, the present invention is not limited the embodiments. That is, without removing an oxidant remaining in the processing chamber 201, a cleaning process may be started. In this case, when a cleaning process is started, a cleaning gas ($BCl_3$) supplied into the processing chamber 201 may be mixed with a modifying gas remaining in the processing chamber 201. Thus, oxygen (O) included in the oxidant (modifying gas) may attach B—Cl bonds of the $BCl_3$ to decompose the $BCl_3$. By this, the rate of etching may be increased within a predetermined oxygen concentration range. However, in the case where $H_2O$ is used as an oxidant, if a purge process is not performed after a modifying process, parts such as pipes of the gas supply system may be corroded.

EXAMPLES

Hereinafter, experimental examples of the present invention will be explained.

Example 1

Figure 11:
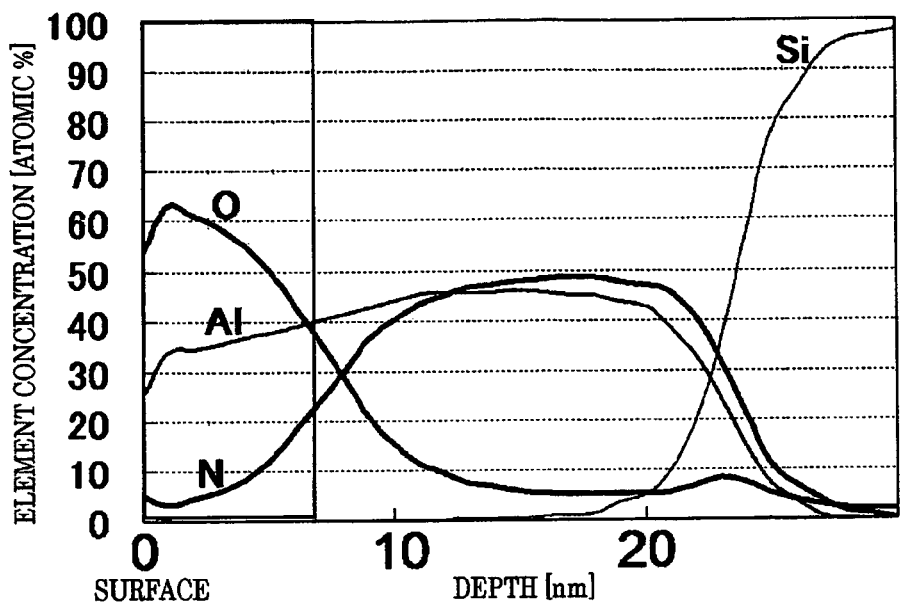
FIG. 11 is a graph illustrating a composition distribution in the depth direction of an aluminum nitride film after a modifying process is performed with an oxidizing time of 1 minute.
Figure 12:
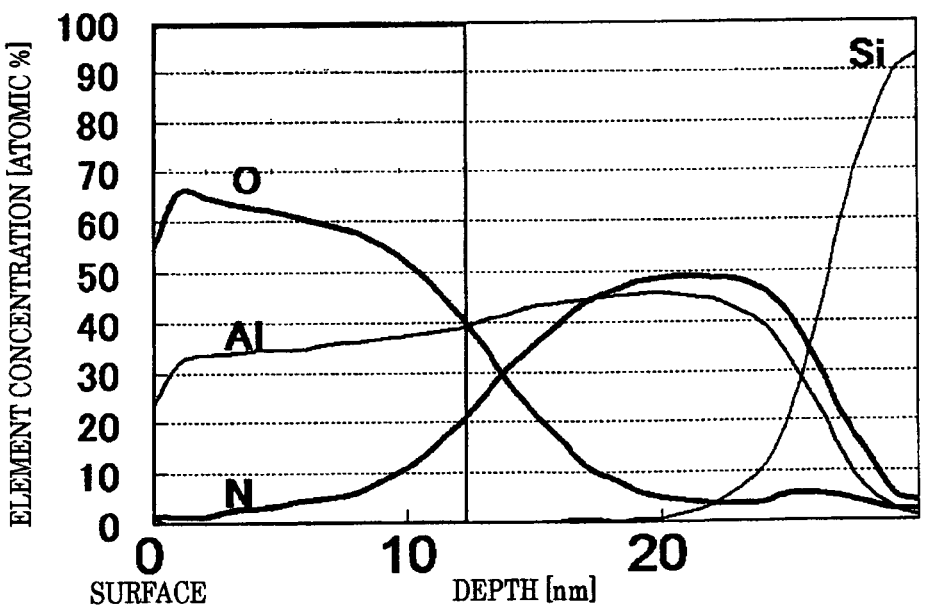
FIG. 12 is a graph illustrating a composition distribution in the depth direction of an aluminum nitride film after a modifying process is performed with an oxidizing time of 5 minutes.

Hereinafter, Example 1 of the present invention will be explained with reference to FIG. 11 and FIG. 12. FIG. 11 and FIG. 12 are graphs illustrating composition distributions in the depth direction of aluminum nitride films after a modification process is performed.

In FIG. 11 and FIG. 12, the horizontal axis denotes a depth (nm) from the surface of an aluminum nitride film after a modifying process was performed. The vertical axis denotes an element concentration (atomic %) measured in the depth direction of the aluminum nitride film by using an X-ray photoelectron spectroscopy (XPS). In the evaluations shown in FIG. 11 and FIG. 12, aluminum nitride films formed on silicon wafers to a thickness of 23 nm were oxidized by using $H_2O$ as a modifying gas (oxidant). The oxidizing times (exposure time to the $H_2O$ atmosphere) were 1 minute and 5 minutes, respectively.

Referring to FIG. 11 and FIG. 12, it could be understood that the surfaces of the aluminum nitride films were oxidized by a modifying process and thus the oxygen concentration was increased but the nitrogen concentration was decreased. That is, the surfaces of the aluminum nitride films were modified into aluminum oxide films by a modifying process. In addition, it could be understood that a more depth of the aluminum nitride film was modified into an aluminum oxide film as the oxidizing time was increased.

Example 2

In the Example, a cleaning gas was supplied to evaluation samples on which a titanium nitride (TiN) film, an aluminum nitride (AlN) film, a titanium aluminum nitride (TiAlN) film, and an aluminum oxide (AlO) film were respectively formed. Then, etching of the films were tested.

In initial evaluation, only a cleaning process was performed on the evaluation samples without performing a modifying process. Only $BCl_3$ was used as a cleaning gas. As a result, sufficient etching effects could be obtained from the aluminum oxide film. However, sufficient etching effects could not obtained from the titanium nitride film, the aluminum nitride film, and the titanium aluminum nitride film.

In the next evaluation, only a cleaning process was performed on the evaluation samples without performing a modifying process. $BCl_3$ to which $O_2$ was added at a concentration of 2% was used as a cleaning gas. As a result, sufficient etching effects could be obtained from the aluminum oxide film and the titanium nitride film. However, sufficient etching effects could not obtained from the aluminum nitride film and the titanium aluminum nitride film. In addition, although the concentration of $O_2$ added to $BCl_3$ was increased from 2% to 10%, the same results were obtained.

In the last evaluation, like in the above-described embodiments, a modifying process was performed on the evaluation samples, and then a cleaning process was performed on the evaluation samples. In the modifying process, $H_2O$ was used as a modifying gas (oxidant) to oxidize the evaluation samples. In the cleaning process, only $BCl_3$ was used as a cleaning gas. As a result, sufficient etching effects could be obtained from any of the titanium nitride film, the aluminum nitride film, and the titanium aluminum nitride film as well as the aluminum oxide film.

As described above, the present invention makes it possible to efficiently remove deposited materials including a conductive film or insulting film adhered to parts such as the inner wall of a processing chamber and a substrate supporting tool disposed in the processing chamber.

[Supplementary Note]

The present invention also includes the following preferred embodiments.

(Supplementary Note 1)

According to an embodiment of the present invention, there is provided a method of manufacturing a semiconductor device, the method comprising:

loading a substrate into a processing chamber;

forming a conductive film or an insulating film on the substrate by supplying a plurality of source gases into the processing chamber;

unloading the substrate from the processing chamber;

modifying a conductive film or an insulating film adhered to the processing chamber by supplying a modifying gas into the processing chamber; and after performing a cycle of the loading, the forming, the unloading, and the modifying processes a plurality of times, removing the modified conductive film or the modified insulating film adhered to the processing chamber by supplying a cleaning gas into the processing chamber.

(Supplementary Note 2)

Preferably, the cleaning gas may be a halogen compound.

(Supplementary Note 3)

Preferably, the conductive film or insulating film may be a nitride film, and the modifying gas may be an oxygen-containing gas.

(Supplementary Note 4)

Preferably, the plurality of source gases may comprise at least one of a halogen or organic compound and a nitrogen-containing gas.

(Supplementary Note 5)

Preferably, after the modifying process is performed once, the removing process may be performed predetermined times.

(Supplementary Note 6)

According to another embodiment of the present invention, there is provided a cleaning method for removing a film adhered to a processing chamber of a substrate processing apparatus configured to form a film on a substrate by supplying a source gas, the cleaning method comprising:

each time a film is formed on a substrate, modifying a film adhered to the processing chamber by supplying a modifying gas into the processing chamber; and removing the film adhered to the processing chamber by supplying a cleaning gas into the processing chamber to remove the modified film.

(Supplementary Note 7)

According to another embodiment of the present invention, there is provided a cleaning method for removing a film adhered to a processing chamber of a substrate processing apparatus configured to form a film on a substrate by supplying a source gas, the cleaning method comprising:

modifying a film adhered to the processing chamber by supplying a modifying gas into the processing chamber; and cleaning the processing chamber by supplying a cleaning gas into the processing chamber to remove a deposited material including the modified film adhered to the processing chamber, wherein the modifying gas is selected such that bonding energy of elements of the modified film is smaller than bonding energy between a cleaning component of the cleaning gas and an element of the modified film.

(Supplementary Note 8)

According to another embodiment of the present invention, there is provided a substrate processing apparatus comprising:

a processing chamber configured to accommodate a substrate;

a source gas supply system configured to supply a plurality of source gases into the processing chamber;

an oxygen-containing gas supply system configured to supply an oxygen-containing gas into the processing chamber;

a cleaning gas supply system configured to supply a cleaning gas into the processing chamber;

an exhaust system configured to exhaust the processing chamber; and a control unit, wherein the control unit is configured to control the source gas supply system, the oxygen-containing gas supply system, the cleaning gas supply system, and the exhaust system, so as to: form a nitride film on the substrate by supplying the plurality of source gases into the processing chamber; modify a nitride film adhered to the processing chamber into an oxide film by oxidizing the nitride film by supplying the oxygen-containing gas into the processing chamber; and remove the oxide film by supplying the cleaning gas into the processing chamber.

(Supplementary Note 9)

Preferably, the cleaning gas may be a halogen compound.

(Supplementary Note 10)

Preferably, the plurality of source gases may comprise at least one of a halogen or organic compound and a nitrogen-containing gas.

(Supplementary Note 11)

According to another embodiment of the present invention, there is provided a cleaning method for removing a metal film or a metal nitride film deposited on a reaction chamber of a film forming apparatus by using a cleaning gas, the cleaning method comprising alternately performing a oxidizing process and a cleaning process on the deposited film at least once to remove the deposited film.

(Supplementary Note 12)

According to another embodiment of the present invention, there is provided a cleaning method comprising:

after a film forming sequence is finished and a product substrate is discharged, forming an oxide layer on a film formed on an inside of a furnace by supplying an oxidant gas into the furnace; and after the film forming sequence and the forming of the oxide layer are repeated, supplying a cleaning gas into the furnace.

(Supplementary Note 13)

Preferably, a film deposited in the furnace may be oxidized by introducing the atmosphere into the furnace.

(Supplementary Note 14)

Preferably, the oxidant gas may comprise one of $O_2$, NO, $O_3$, $H_2O$, and $H_2+O_2$.

(Supplementary Note 15)

Preferably, the deposited film may comprise an aluminum nitride (AlN) film.

(Supplementary Note 16)

Preferably, the deposited film may comprise a titanium aluminum nitride (TiAlN) film.

(Supplementary Note 17)

Preferably, the cleaning gas may comprise $BCl_3$ or $Cl_2$.

(Supplementary Note 18)

Preferably, while the cleaning gas is supplied, an oxidant may be simultaneously supplied into a processing chamber.

(Supplementary Note 19)

According to another embodiment of the present invention, there is provided a cleaning method comprising:

after a film forming sequence is finished and a product substrate is discharged, forming an oxide layer on a film formed on an inside of a processing chamber by supplying an oxidant into the processing chamber; and after the film forming sequence and the forming of the oxide layer are repeated, performing a cleaning process.

(Supplementary Note 20)

According to another embodiment of the present invention, there is provided a semiconductor device formed by the substrate processing apparatus.

(Supplementary Note 21)

According to another embodiment of the present invention, there is provided a method of manufacturing a semiconductor device, the method comprising:

loading a substrate into a processing chamber;

forming a conductive film or an insulating film on the substrate by supplying a plurality of source gases into the processing chamber;

unloading the substrate from the processing chamber; and modifying a conductive film or an insulating film adhered to the processing chamber by supplying a modifying gas into the processing chamber; and cleaning the processing chamber by supplying a cleaning gas into the processing chamber to remove a deposited material including the modified film adhered to the processing chamber.

(Supplementary Note 22)

Preferably, the loading, the forming, the unloading, and the modifying processes may be set as one cycle, and each time the cycle may be performed predetermined times, the cleaning process may be performed.

(Supplementary Note 23)

Alternatively, after the conductive film or the insulating film adhered to the processing chamber grows to a predetermined thickness, the modifying process and the cleaning process may be performed.

(Supplementary Note 24)

Preferably, the modifying process and the cleaning process may be alternately performed predetermined times.

(Supplementary Note 25)

Alternatively, after the modifying process is be performed once, the cleaning process may be performed predetermined times.

(Supplementary Note 26)

Preferably, in the cleaning process, supplying of the cleaning gas and exhausting of the processing chamber may be alternately repeated predetermined times.

(Supplementary Note 27)

Preferably, the conductive film or the insulating film formed in the forming process may be a nitride film, and the modifying gas may be an oxygen-containing gas.

(Supplementary Note 28)

Preferably, the plurality of source gases may comprise at least one of a halogen or organic compound and a nitrogen (N)-containing source.

(Supplementary Note 29)

Preferably, the plurality of source gases may comprise at least one of Al, Ti, and Si.

(Supplementary Note 30)

Preferably, the nitrogen-containing source may comprise at least one selected from the group consisting of $NH_3$, $N_2$, $N_2O$, and $CH_6N_2$.

(Supplementary Note 31)

Preferably, the nitride film may be one selected from the group consisting of AlN, TiN, TiAlN, TiSiN, TaN, TaSiN, and SiN films.

(Supplementary Note 32)

Preferably, the oxygen-containing source may comprise at least one selected from the group consisting of $O_2$, $O_3$, $H_2O$, $H_2+O_2$, $CO_x$, $SO_x$, $N_xO$ (where x denotes an integer equal to or greater than 1).

(Supplementary Note 33)

Preferably, the cleaning gas may be a halogen-based gas.

(Supplementary Note 34)

Preferably, the cleaning gas may comprise at least one selected from the group consisting of $BCl_3$, HCl, $Cl_2$, $SiCl_4$, HBr, $BBr_3$, $SiBr_4$, and $Br_2$.

(Supplementary Note 35)

Preferably, the forming process may performed while keeping the substrate at 400° C. or lower, preferably, at 350° C.

(Supplementary Note 36)

Preferably, the oxygen-containing source may be $H_2O$ or $H_2+O_2$, and the modifying process may be performed while keeping the inside atmosphere of the processing chamber at a predetermined temperature between 400° C. and 800° C.

(Supplementary Note 37)
Preferably, the cleaning process may be performed while keeping the inside atmosphere of the processing chamber at a predetermined temperature between 500° C. and 850° C.

(Supplementary Note 38)
Preferably, in the modifying process, the atmosphere may be introduced into the processing chamber to oxidize the conductive film or insulating film adhered to the processing chamber.

(Supplementary Note 39)
According to another embodiment of the present invention, there is provided a substrate processing apparatus comprising:
a processing chamber configured to accommodate a substrate;
a source gas supply unit configured to supply a plurality of source gases into the processing chamber;
a modifying gas supply unit configured to supply a modifying gas into the processing chamber;
a cleaning gas supply unit configured to supply a cleaning gas into the processing chamber;
an exhaust unit configured to exhaust the processing chamber; and
a control unit,
wherein the control unit is configured to control the source gas supply unit, the modifying gas supply unit, the cleaning gas supply unit, and the exhaust unit, so as to: form a film on the substrate by supplying the plurality of source gases into the processing chamber; modify a film adhered to the processing chamber by supplying the modifying gas into the processing chamber; and clean the modified film by supplying the cleaning gas into the processing chamber.

(Supplementary Note 40)
According to another embodiment of the present invention, there is provided a cleaning method for removing a film adhered to a processing chamber of a substrate processing apparatus configured to form a film on a substrate by supplying a source gas, the cleaning method comprising:
modifying a film adhered to the processing chamber by supplying a modifying gas into the processing chamber; and
cleaning the processing chamber by supplying a cleaning gas into the processing chamber to remove the modified film adhered to the processing chamber.

(Supplementary Note 41)
According to another embodiment of the present invention, there is provided a cleaning method for removing a nitride film adhered to a processing chamber of a substrate processing apparatus configured to form a nitride film on a substrate by supplying a source gas, the cleaning method comprising:
modifying the nitride film into an oxide film by supplying an oxygen-containing gas into the processing chamber; and
removing the oxide film by supplying a halogen-based gas into the processing chamber.

(Supplementary Note 42)
According to another embodiment of the present invention, there is provided a cleaning method for removing a film adhered to a processing chamber of a substrate processing apparatus configured to form a film on a substrate by supplying a source gas, the cleaning method comprising:
modifying a film adhered to the processing chamber by supplying a modifying gas into the processing chamber; and
cleaning the processing chamber by supplying a cleaning gas into the processing chamber to remove a deposited material including the modified film adhered to the processing chamber,
wherein the modifying gas is selected such that bonding energy of elements of the modified film is smaller than bonding energy between a cleaning component of the cleaning gas and an element of the modified film.

What is claimed is:
1. A method of manufacturing a semiconductor device, the method comprising:
(a) loading a substrate into a processing chamber;
(b) forming a nitride film including a conductive film or an insulating film on the substrate by alternately supplying a plurality of source gases into the processing chamber;
(c) unloading the substrate from the processing chamber;
(d) changing a composition of the nitride film adhered to the processing chamber formed in the step (b) into an oxide film by oxidizing the nitride film adhered to the processing chamber by supplying an oxygen-containing gas into the processing chamber; and
(e) removing the oxide film by supplying a cleaning gas into the processing chamber and exhausting the cleaning gas from the processing chamber after performing a cycle of the steps (a), (b), (c) and (d) a plurality of times,
wherein a nitro n concentration of a surface of the nitride film adhered to the processing chamber is decreased and an oxygen concentration of the surface of the nitride film adhered to the processing chamber is increased in the step (d).

2. The method of claim 1, wherein the cleaning gas is a halogen compound.

3. The method of claim 2, wherein the plurality of source gases comprise at least one of a halogen or organic compound and a nitrogen-containing gas.

4. The method of claim 1, wherein the step (e) is performed a predetermined number of times after the step (d) is performed once.

5. The method of claim 1, wherein the steps (b) and (d) are performed at different temperatures.

6. The method of claim 1, wherein the cleaning gas comprises a gas reactive with the oxide film to generate a reaction product with a high vapor pressure.

7. The method of claim 1, wherein the cleaning gas comprises at least one gas selected from a group consisting of $BCl_3$, $HCl$, $Cl_2$, $SiCl_4$, $HBr$, $BBr_3$, $SiBr_4$ and $Br_2$.

8. The method of claim 1, wherein the nitride film comprises a film selected from a group consisting of AlN, TiN, TiAlN, TiSiN, TaN, TaSiN and SiN films.

9. The method of claim 1, wherein the oxygen-containing source comprises at least one gas selected from a group consisting of $O_2$, $O_3$, $H_2O$, $H_2+O_2$, $CO_x$, $SO_x$ and $N_xO$, wherein x is an integer equal to or greater than 1.

10. The method of claim 1, wherein nitrogen atoms in the nitride film adhered to the processing chamber are replaced with oxygen atoms in the step (d).

11. A cleaning method for removing a nitride film adhered to a processing chamber of a substrate processing apparatus configured to process a substrate by supplying a source gas, the cleaning method comprising:
(a) changing a composition of the nitride film adhered to the processing chamber into an oxide film by oxidizing the nitride film adhered to the processing chamber by supplying an oxygen-containing gas into the processing chamber; and
(b) removing the oxide film by alternately repeating supplying a cleaning gas into the processing chamber and exhausting the cleaning gas from the processing chamber,
wherein a nitrogen concentration of a surface of the nitride film adhered to the processing chamber is decreased and an oxygen concentration of the surface of the nitride film adhered to the processing chamber is increased in the step (a).

12. A method of manufacturing a semiconductor device, the method comprising:
   (a) loading a boat holding a substrate into a processing chamber;
   (b) forming a nitride film including a conductive film or an insulating film on the substrate by alternately supplying a plurality of source gases into the processing chamber;
   (c) unloading the boat from the processing chamber;
   (d) discharging the substrate from the boat and loading the boat without the substrate into the processing chamber;
   (e) changing a composition of the nitride film adhered to the processing chamber and the boat formed in the step (b) into an oxide film by oxidizing the nitride film adhered to the processing chamber and the boat by supplying an oxygen-containing gas into the processing chamber; and
   (f) removing the oxide film adhered to the processing chamber and the boat by supplying a cleaning gas into the processing chamber and exhausting the cleaning gas from the processing chamber after performing a cycle of the steps (a), (b), (c), (d) and (e) a plurality of times,
   wherein a nitrogen concentration of a surface of the nitride film adhered to the processing chamber is decreased and an oxygen concentration of the surface of the nitride film adhered to the processing chamber is increased in the step (e).

13. The method of claim 12, wherein the oxygen-containing gas comprises a mixture of $O_2$ gas and $H_2$ gas.

14. The method of claim 12, wherein the nitride film comprises a film selected from a group consisting of AlN, TiN, TiAlN, TiSiN, TaN, TaSiN and SiN films.

15. The method of claim 12, wherein the oxygen-containing source comprises at least one gas selected from a group consisting of $O_2$, $O_3$, $H_2O$, $H_2+O_2$, $CO_x$, $SO_x$ and $N_xO$, wherein x is an integer equal to or greater than 1.

16. The method of claim 12, wherein nitrogen atoms in the nitride film adhered to the processing chamber are replaced with oxygen atoms in the step (e).

17. A cleaning method for removing a nitride film adhered to a processing chamber of a substrate processing apparatus configured to process a substrate by: loading a boat holding the substrate into the processing chamber; processing the substrate by alternately supplying a plurality of source gases into the processing chamber; and unloading the boat from the processing chamber, the cleaning method comprising:
   (a) discharging the substrate from the boat and loading the boat without the substrate into the processing chamber;
   (b) changing a composition of the nitride film adhered to the processing chamber and the boat into an oxide film by oxidizing the nitride film adhered to the processing chamber and the boat by supplying an oxygen-containing gas into the processing chamber; and
   (c) removing the oxide film adhered to the processing chamber and the boat by supplying a cleaning gas into the processing chamber and exhausting the cleaning gas from the processing chamber after the nitride film is formed on the substrate a plurality of times,
   wherein a nitrogen concentration of a surface of the nitride film adhered to the processing chamber is decreased and an oxygen concentration of the surface of the nitride film adhered to the processing chamber is increased in the step (b).

* * * * *